United States Patent
Shively

(10) Patent No.: US 6,590,289 B2
(45) Date of Patent: Jul. 8, 2003

(54) HEXADECAGONAL ROUTING

(75) Inventor: John Shively, Benicia, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/859,880

(22) Filed: May 17, 2001

(65) Prior Publication Data

US 2003/0025205 A1 Feb. 6, 2003

(51) Int. Cl.$^7$ ............................................. H01L 23/48
(52) U.S. Cl. ................................... 257/758; 257/760
(58) Field of Search ................................ 257/369, 401, 257/758–760; 438/118, 199, 284, 286, 622, 624

(56) References Cited

U.S. PATENT DOCUMENTS

| | | | | |
|---|---|---|---|---|
| 4,737,837 A | * | 4/1988 | Lee | 326/102 |
| 5,331,192 A | * | 7/1994 | Kudoh | 257/368 |
| 5,872,380 A | * | 2/1999 | Rostoker et al. | 257/369 |
| 6,407,434 B1 | * | 6/2002 | Rostoker et al. | 257/401 |
| 2002/0024143 A1 | * | 2/2002 | Or-Bach et al. | 257/758 |

* cited by examiner

Primary Examiner—Hoai Ho
Assistant Examiner—Long Tran
(74) Attorney, Agent, or Firm—Mitchell, Silberberg & Knupp, LLP

(57) ABSTRACT

Cell terminals in an integrated circuit is interconnected by using multiple layers of conductors that are routed both orthogonally and non-orthogonally to each other. Non-orthogonally routed conductors have slopes that are ratios of non-zero integers which approximate ceratin predetermined angles. The integers in the ratios are chosen from integers generated by sequence equations. The conductors are routed by following grid lines in a grid system comprising both orthogonal grid lines and non-orthogonal grid lines having slopes generated by the sequence equations. Ratios of integers are used to approximate certain angles so that the conductors would intersect the cell terminals located on the fundamental grid intersection points. The conductors in different metal layers form different angles with other conductors in other metal layers based on the slopes of the conductors.

66 Claims, 17 Drawing Sheets

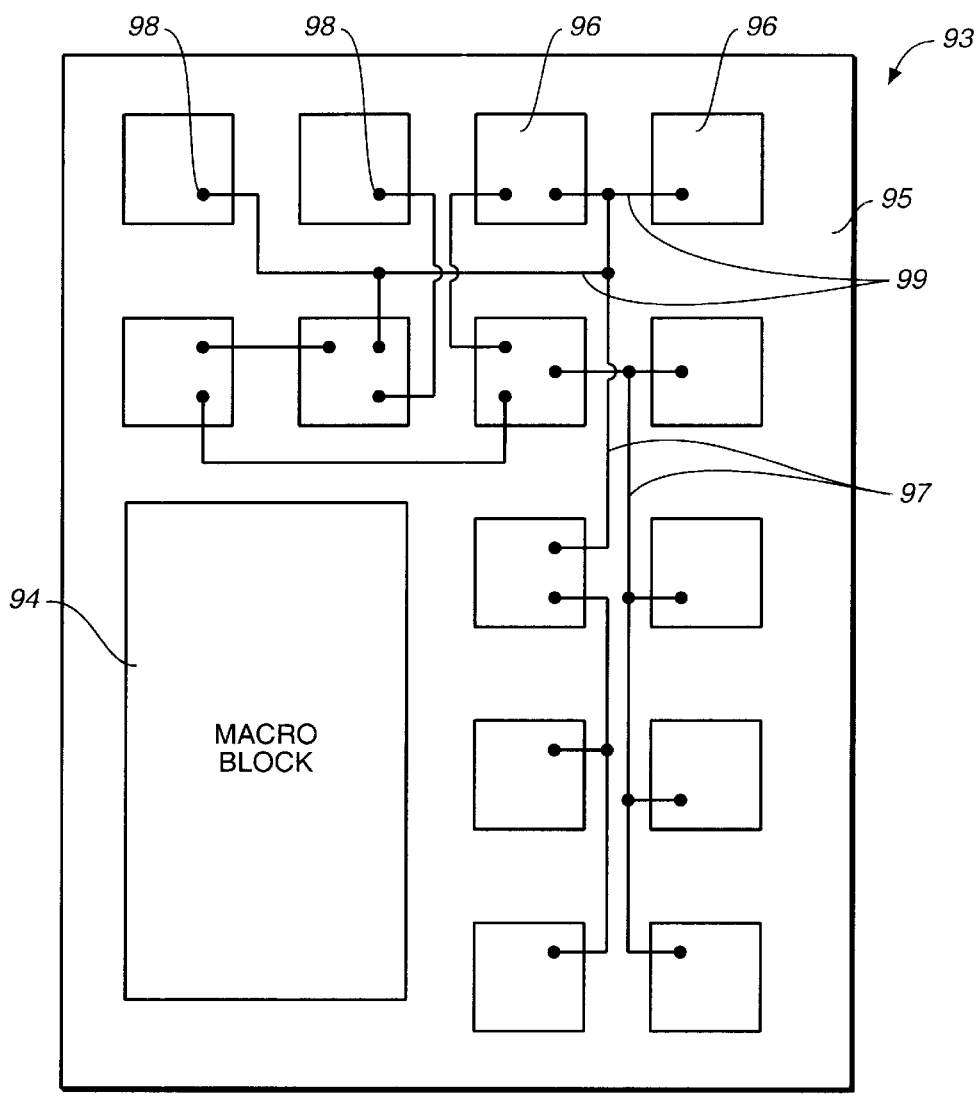
FIG._1 *(PRIOR ART)*
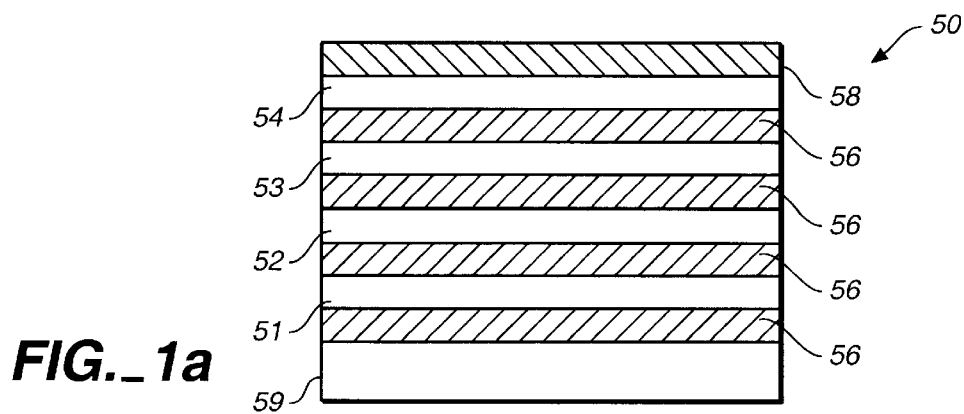
FIG._1a

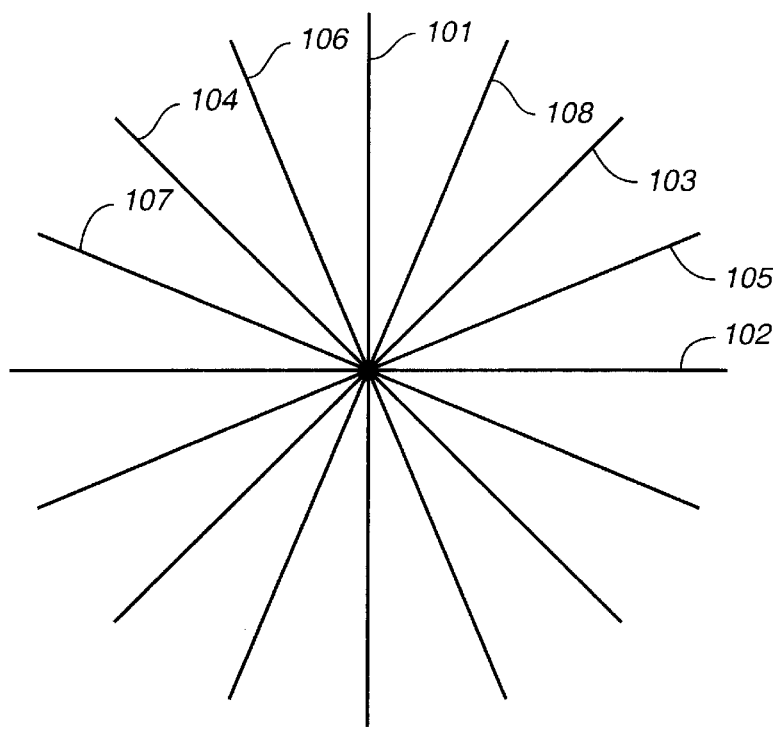
FIG._2
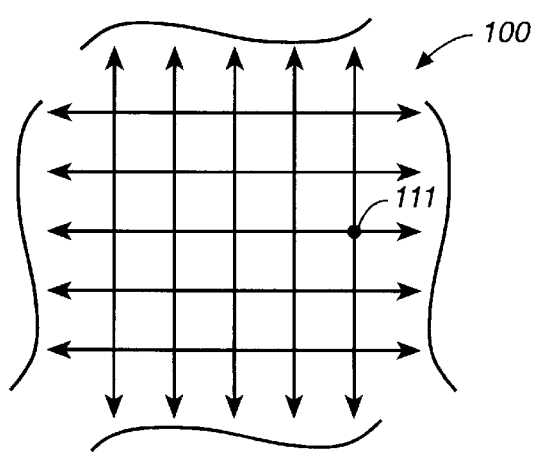 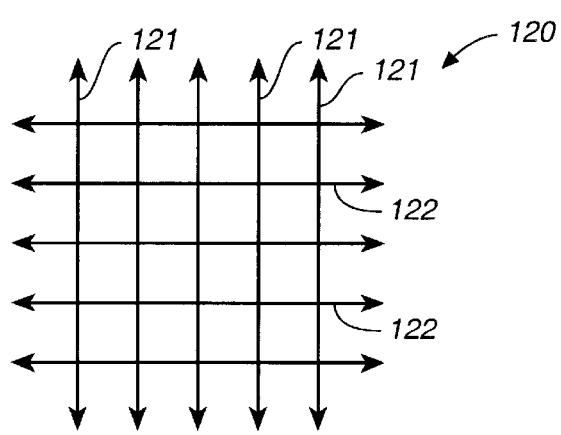
FIG._3  FIG._4

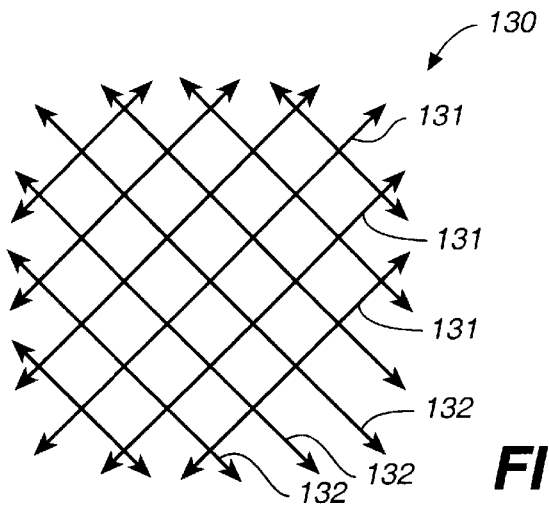
FIG._5
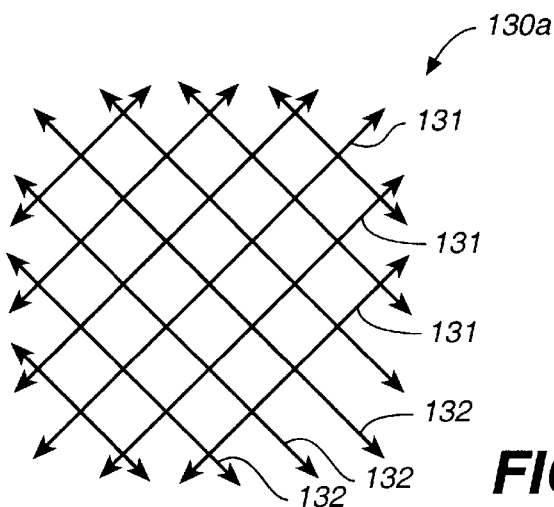
FIG._5a
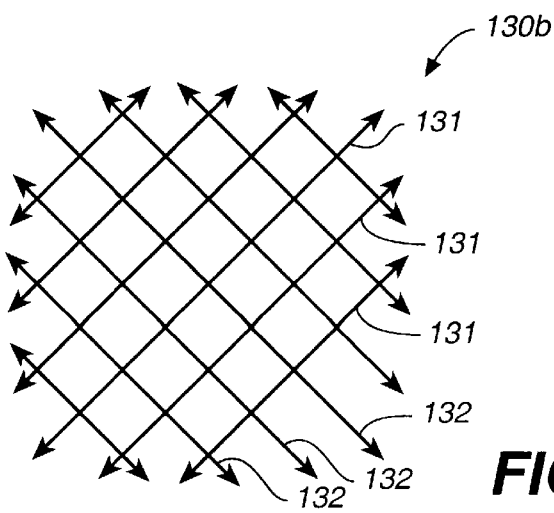
FIG._5b

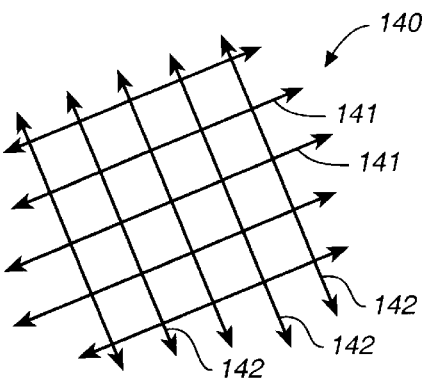
FIG._6
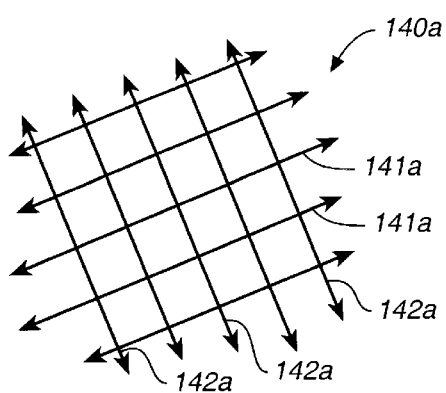
FIG._6a
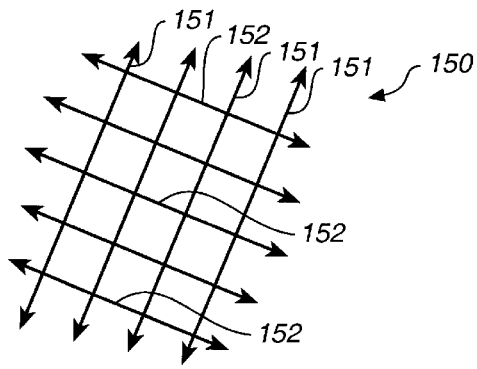
FIG._7
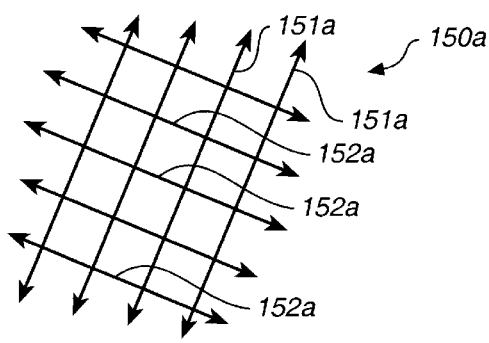
FIG._7a
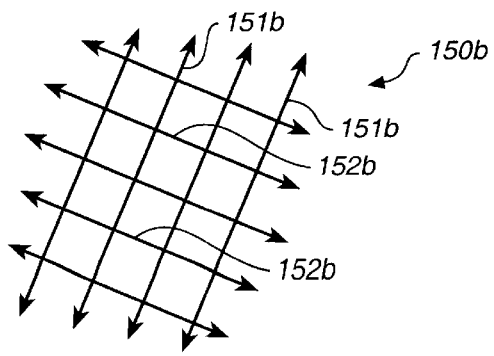
FIG._7b
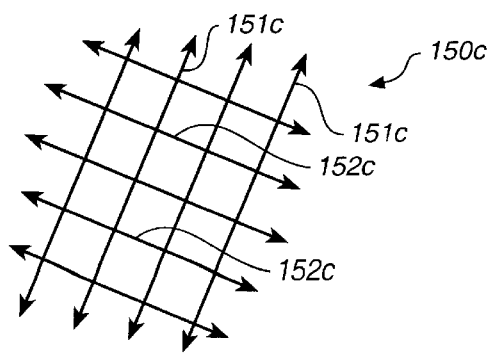
FIG._7c

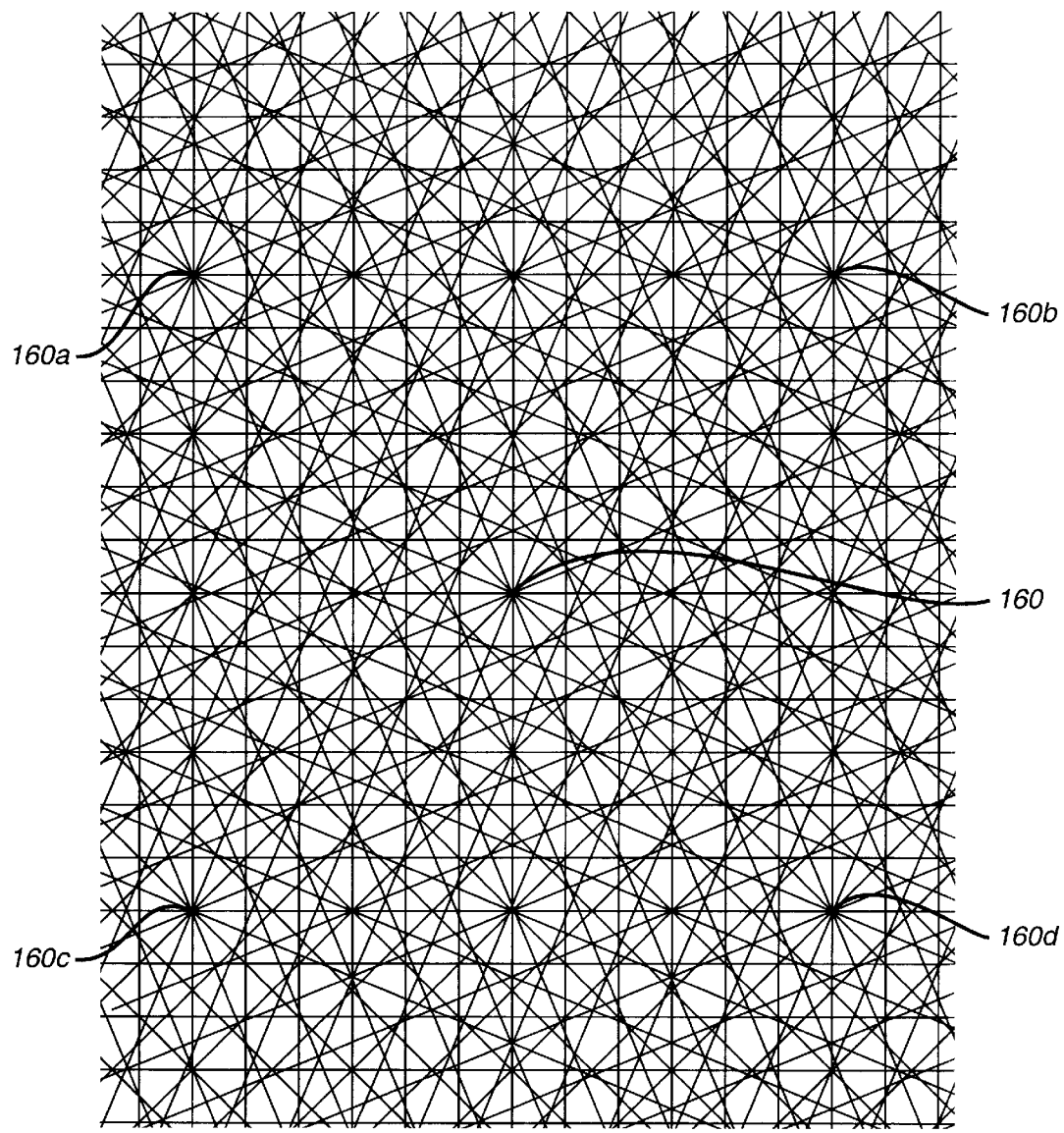
FIG._8

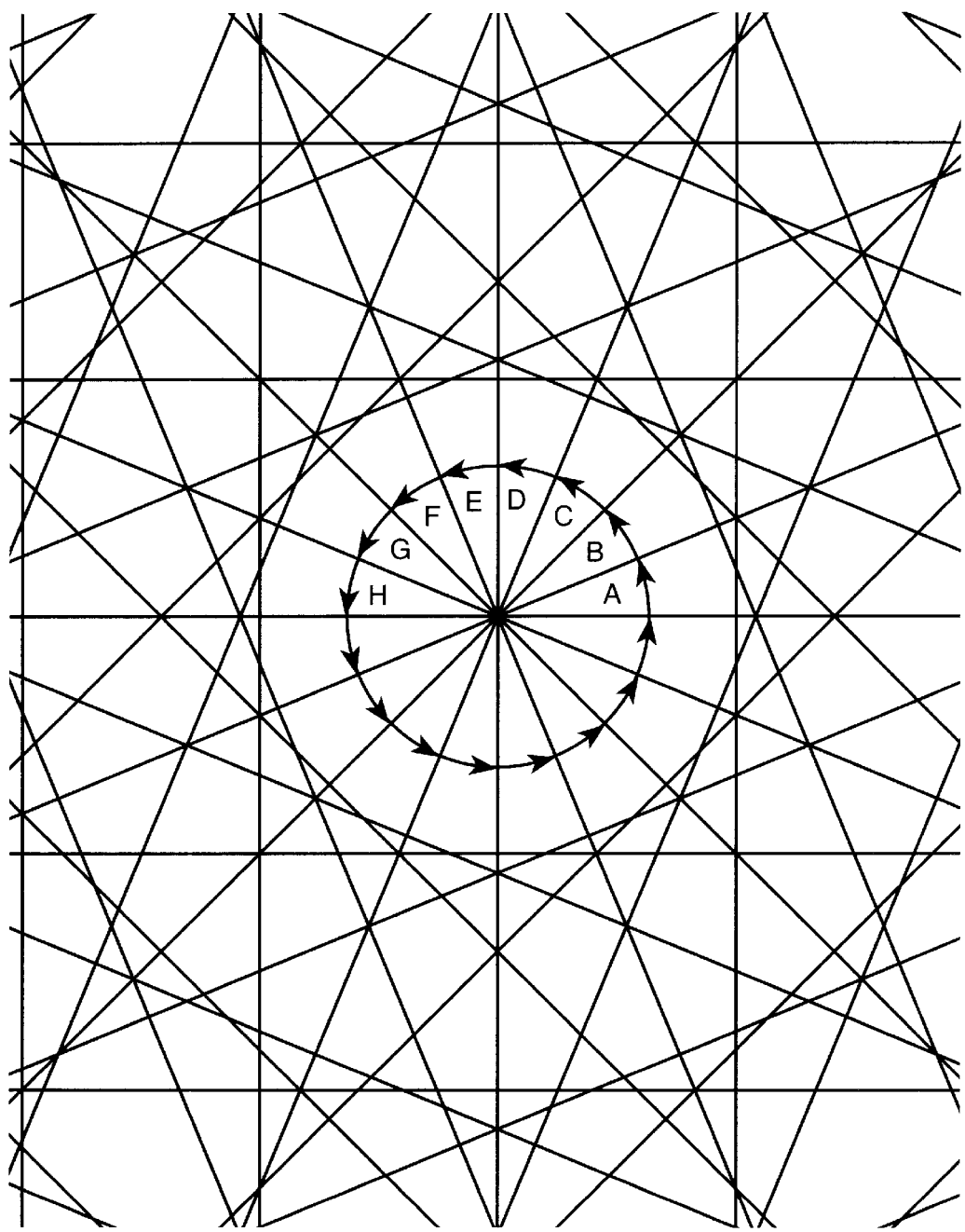
*FIG._9*

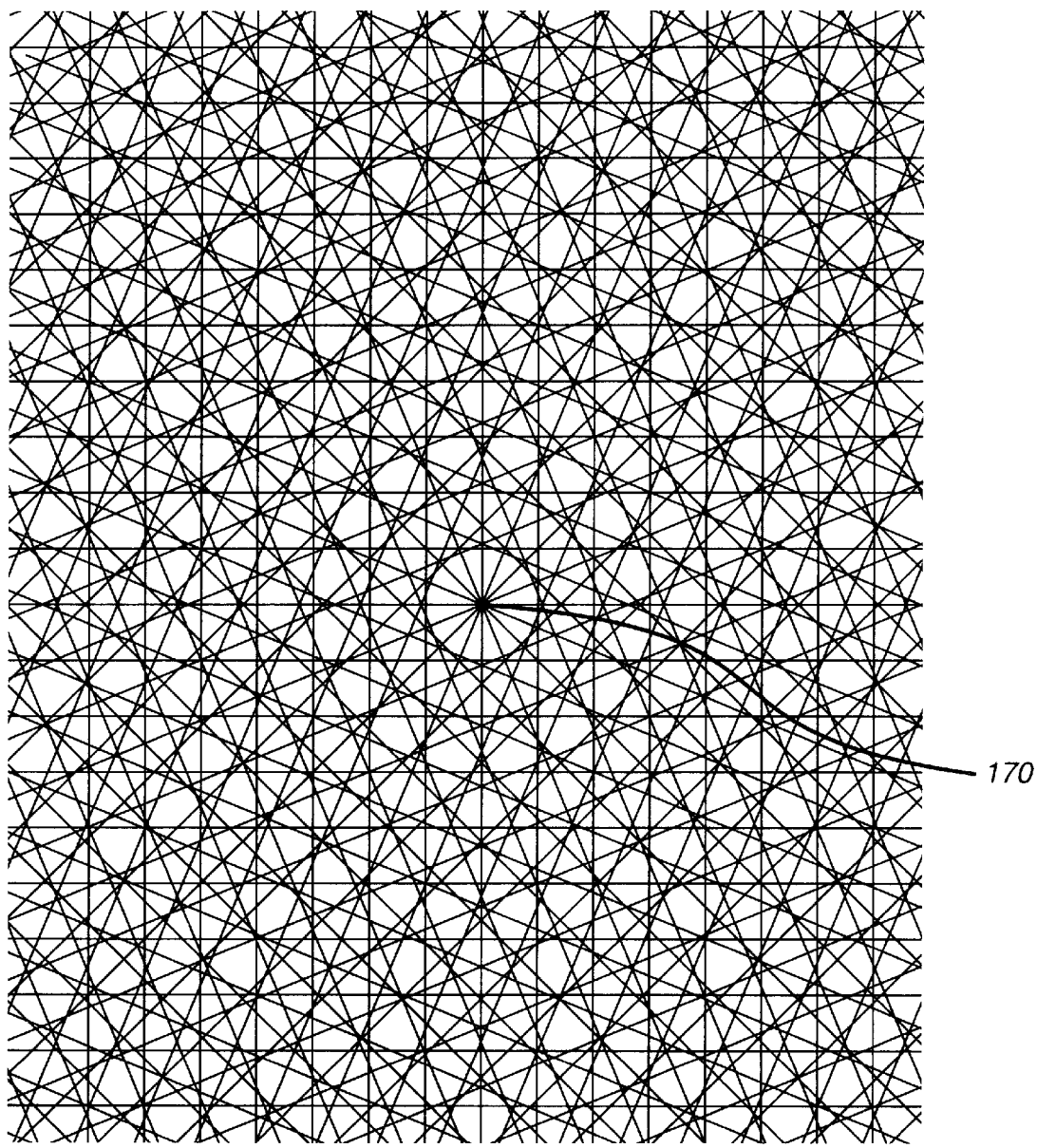
FIG._10

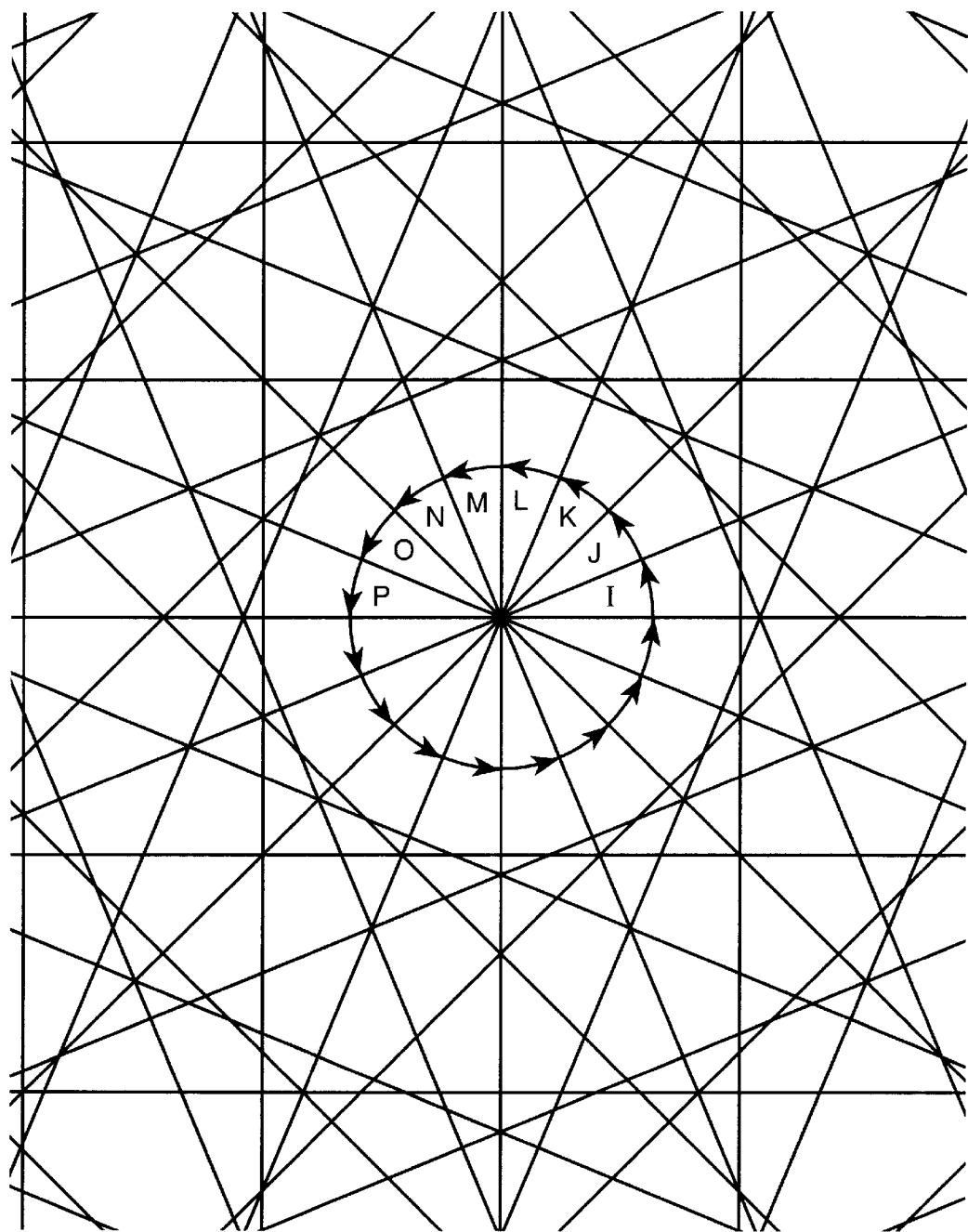
FIG._11

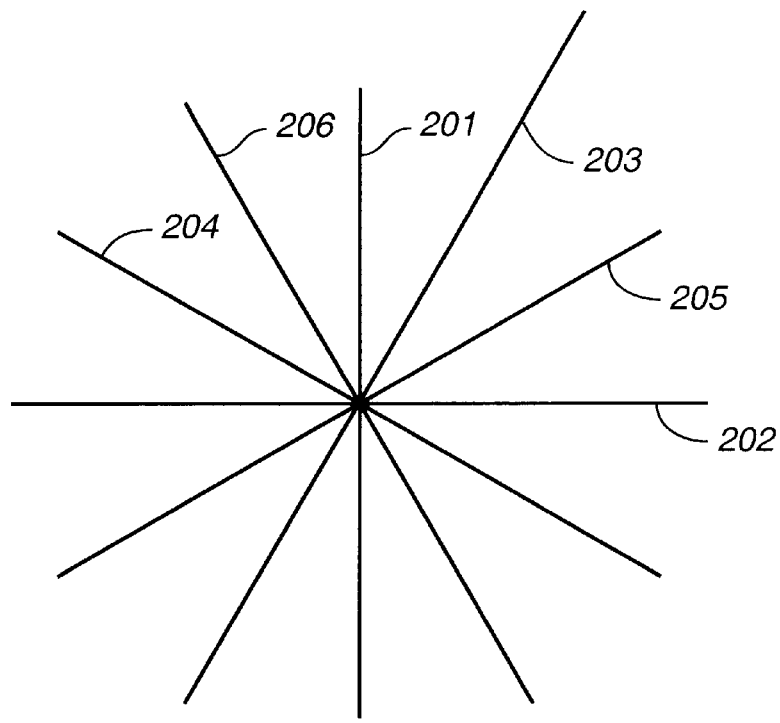
FIG._12
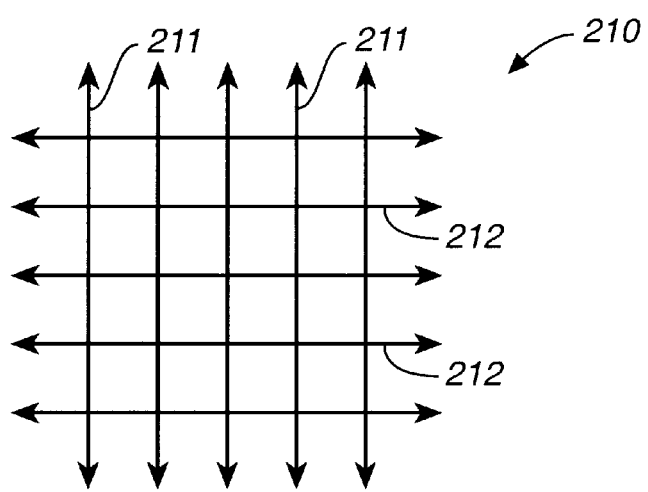
FIG._13

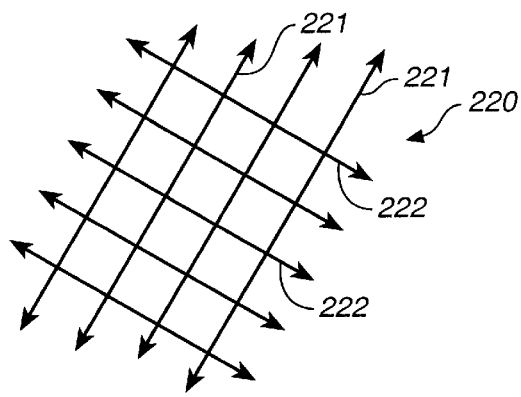
FIG._14
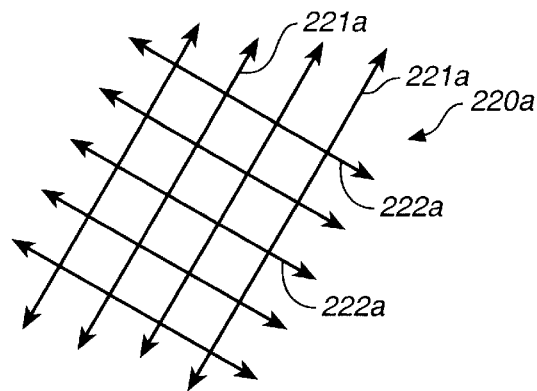
FIG._14a
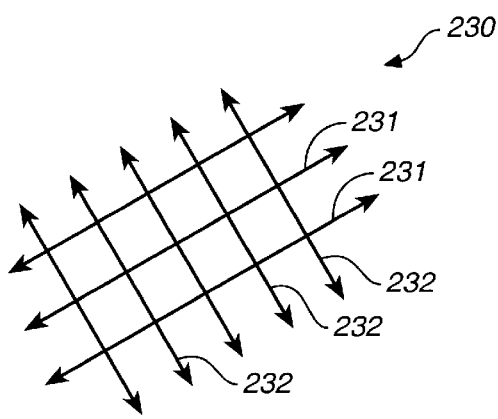
FIG._15
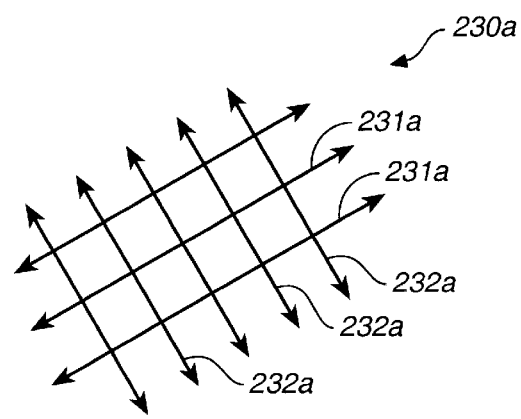
FIG._15a

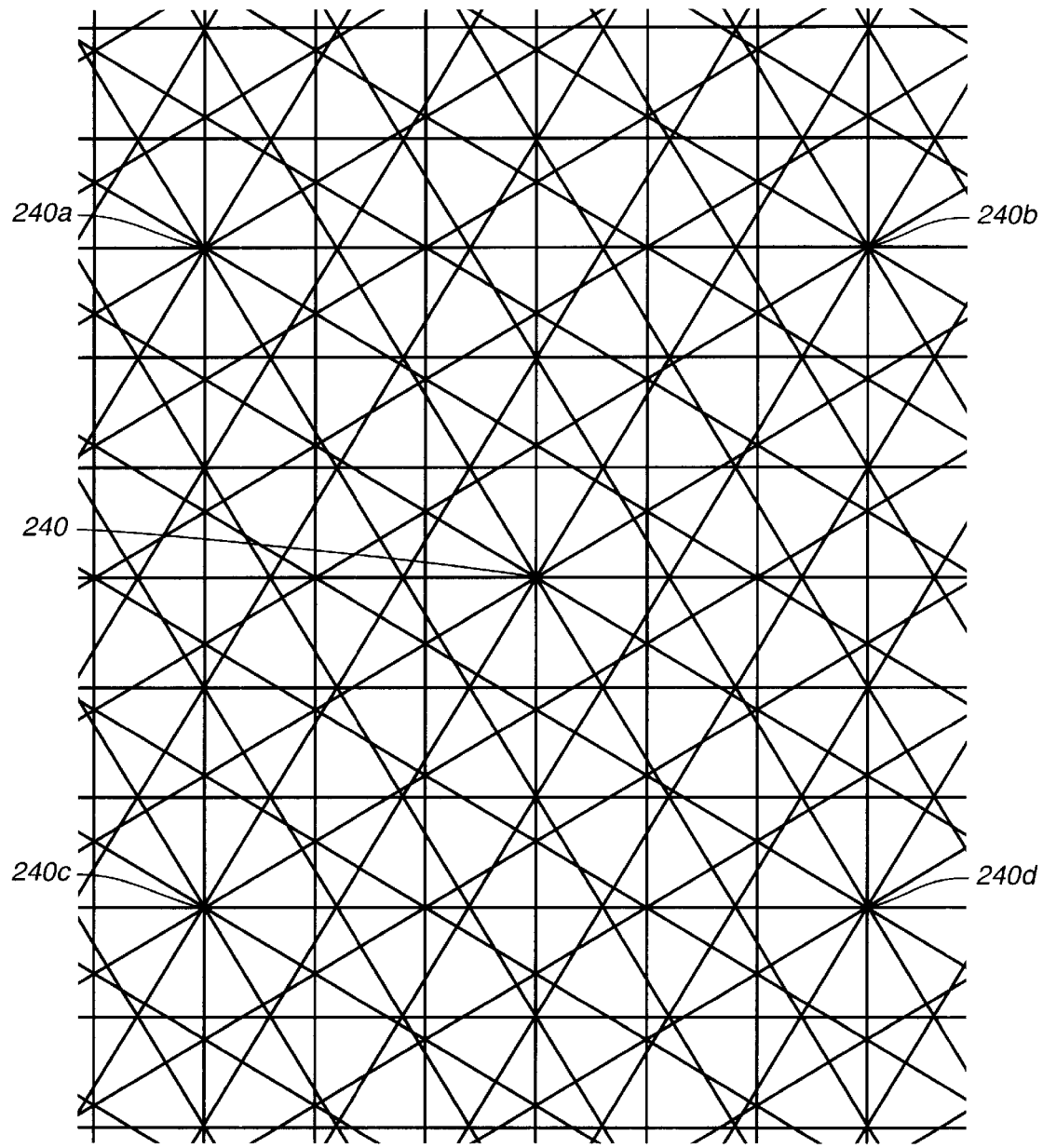
FIG._16

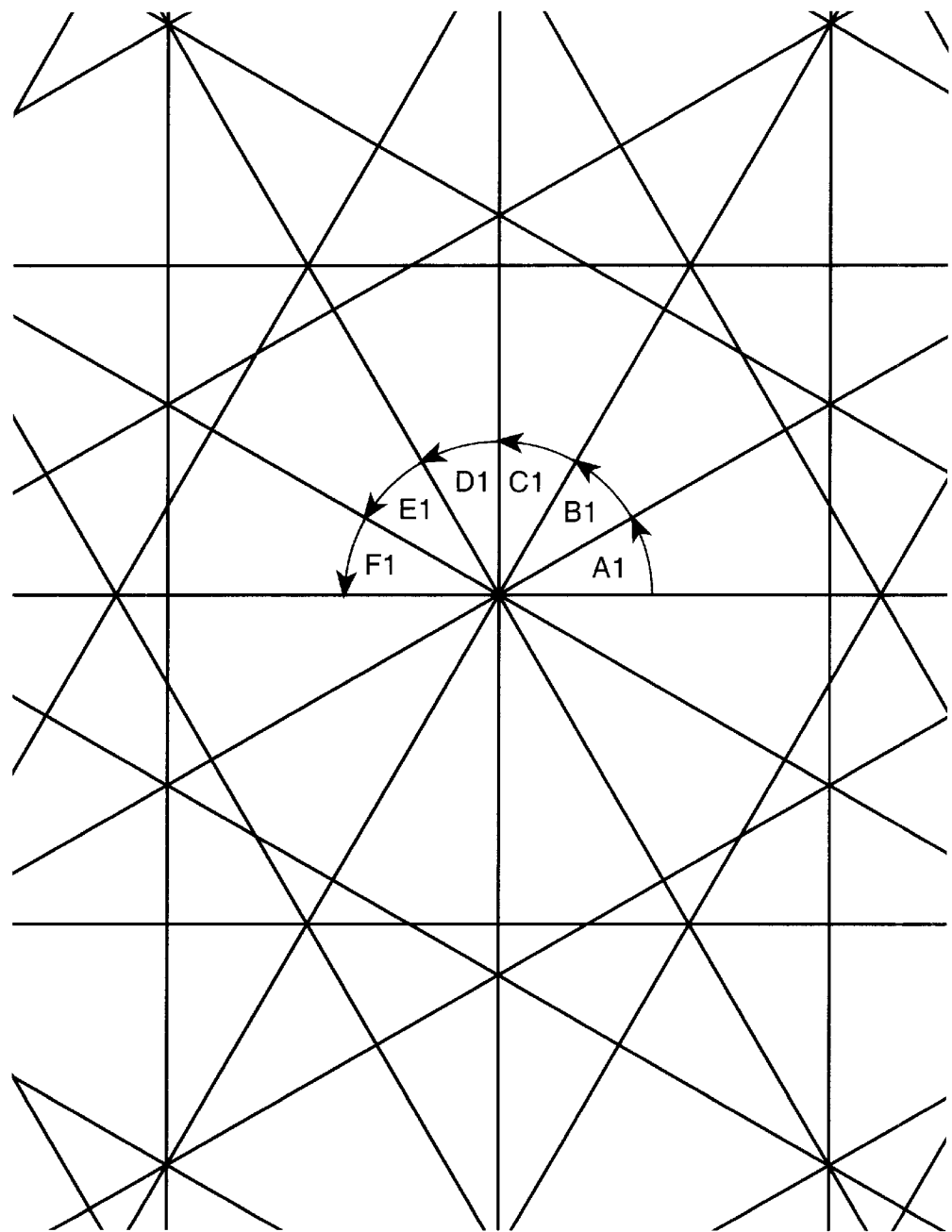
FIG._17

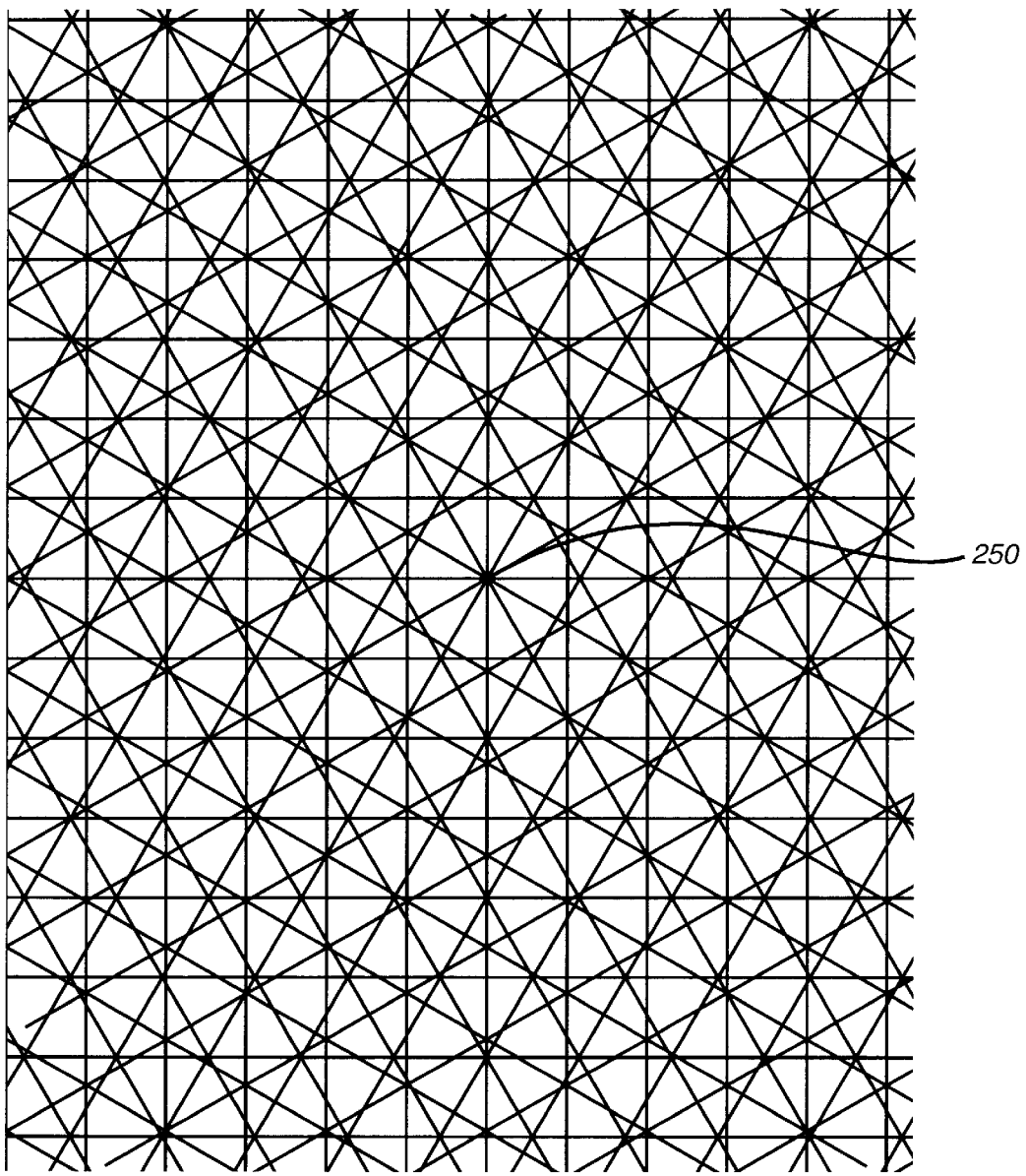
FIG._18

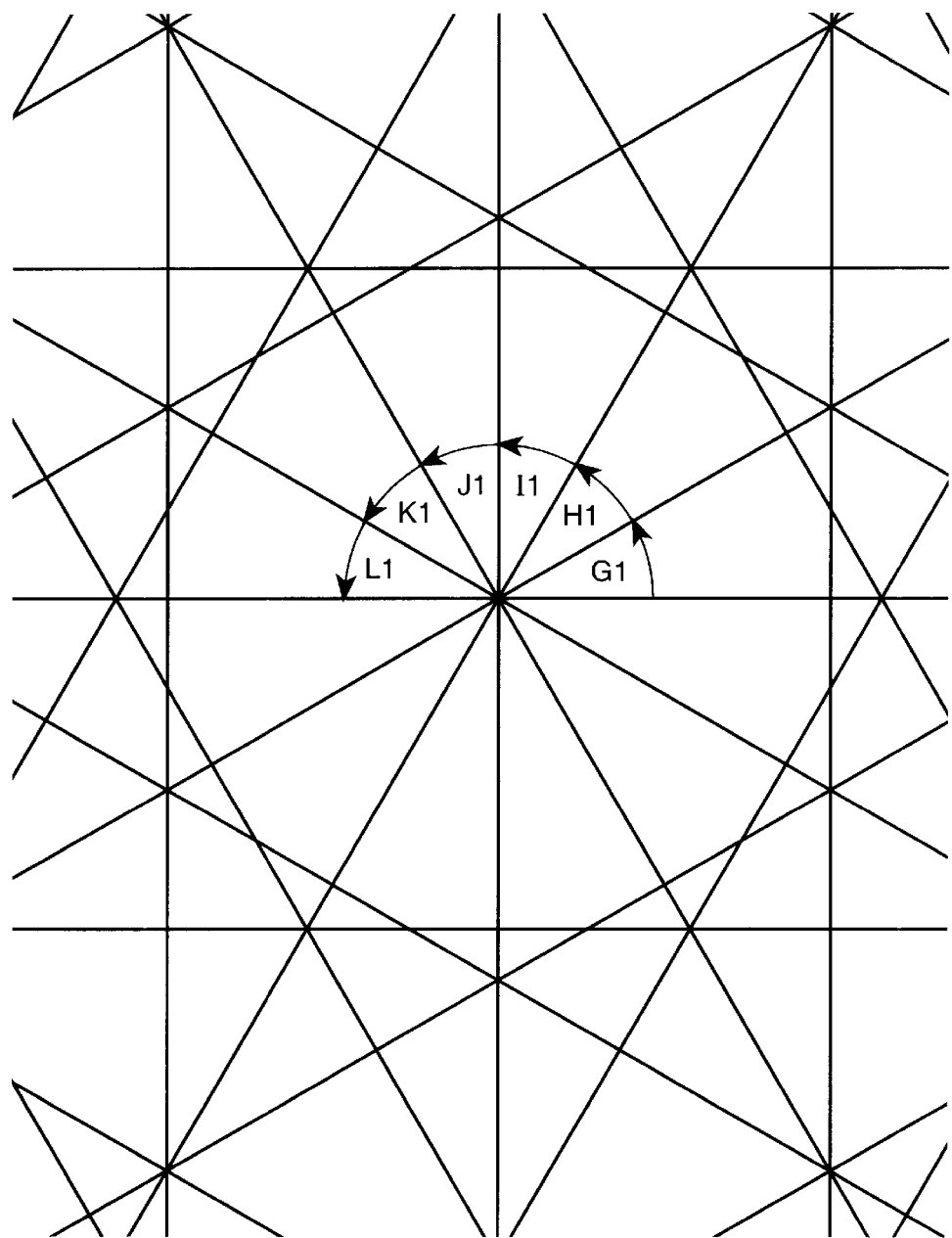
FIG._19

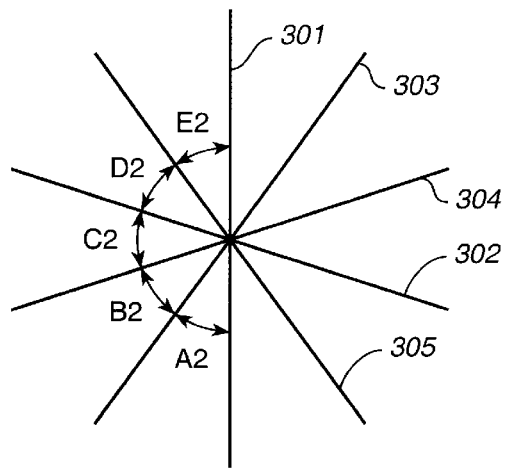
FIG._20
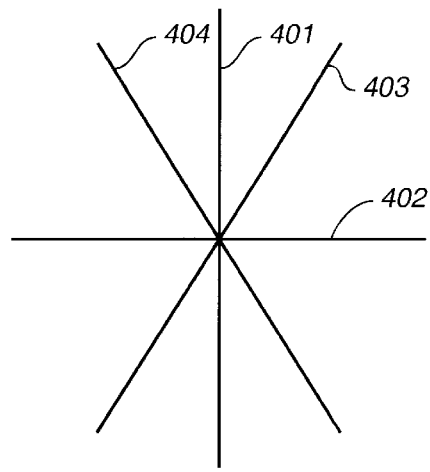
FIG._21
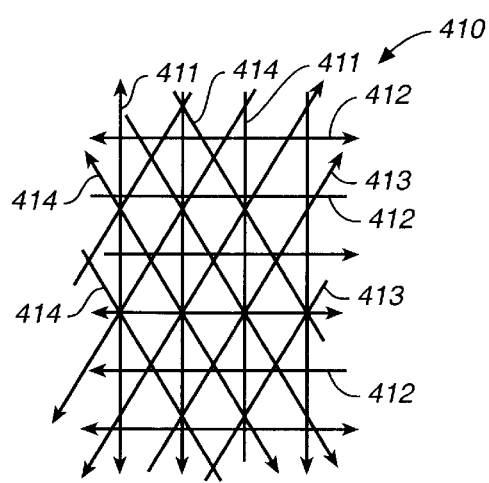
FIG._22
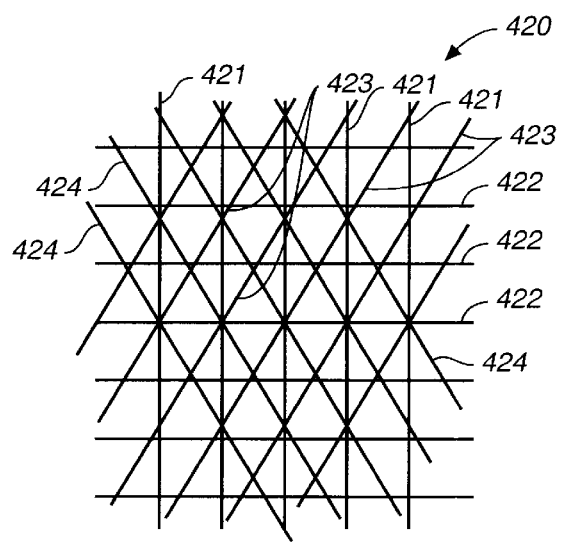
FIG._23

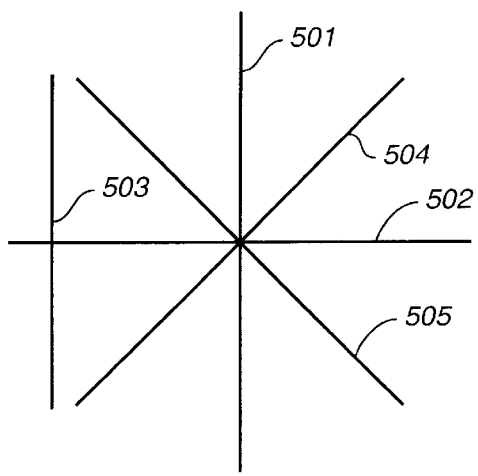
FIG._24
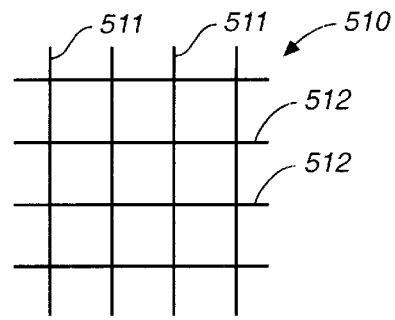
FIG._25
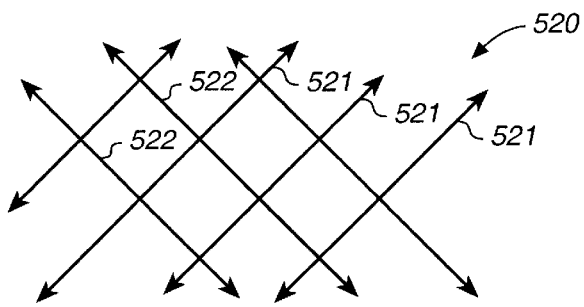
FIG._26
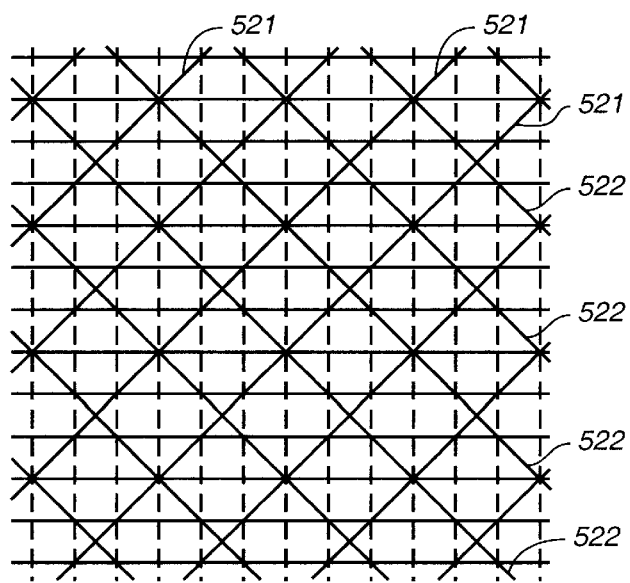
FIG._27

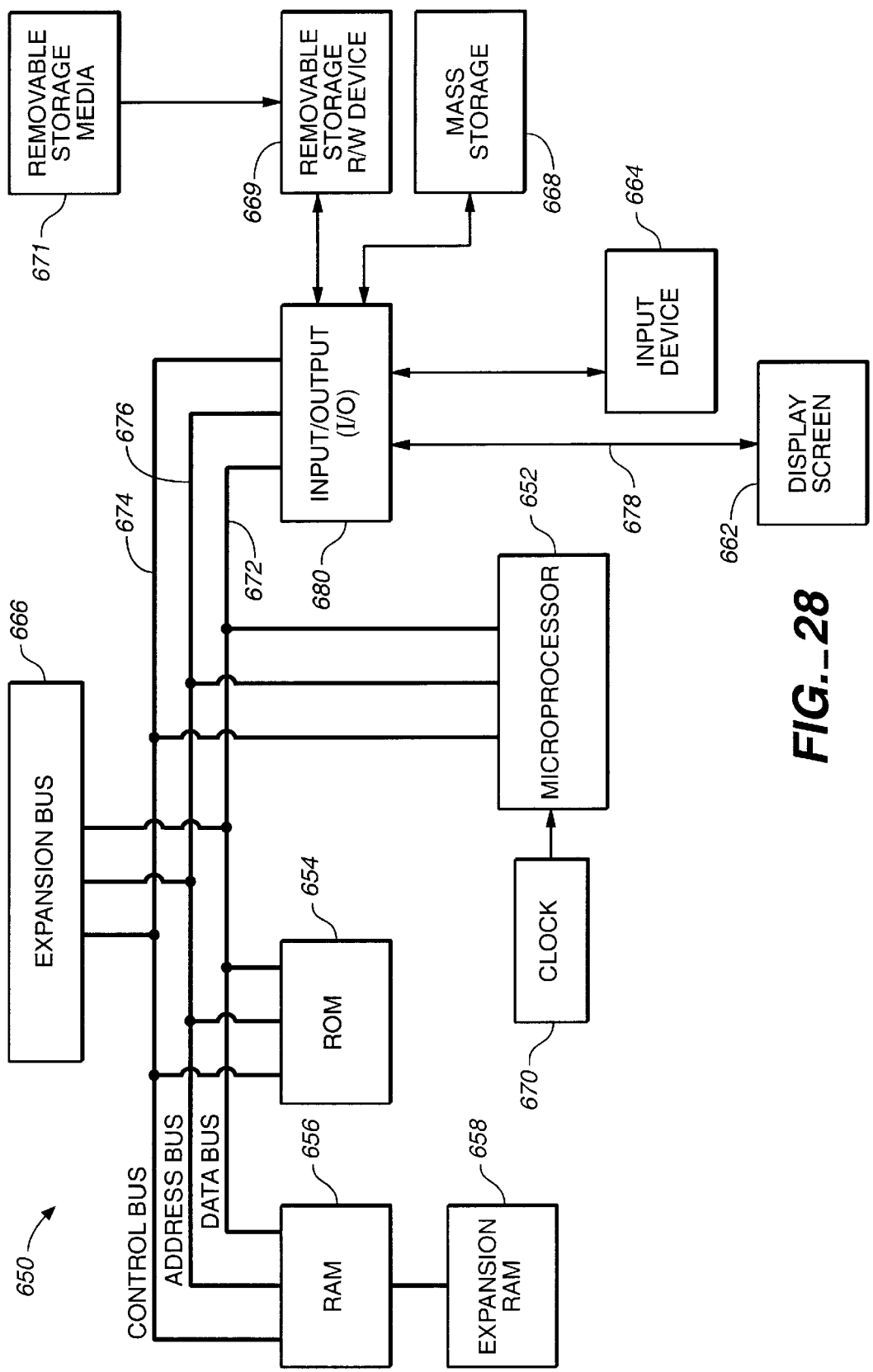
FIG._28

HEXADECAGONAL ROUTING

BACKGROUND OF THE INVENTION

1. Field of the Invention

The present invention generally relates to the art of microelectronic integrated circuits. In particular, the present invention relates to the art of using multiple layers of metals to route the cells in integrated circuits.

2. Description of the Prior Art

The fabrication of semiconductor devices has progressed significantly over the last four decades. Some semiconductor chips incorporate over a million transistors. However, the demand for more functionality will require an increase in the number of transistors that need to be integrated on a chip. This will require shrinking the area required to fabricate interconnected transistors or will require larger die sizes, or both. As the feature size decreases and the area required to fabricate transistors decreases, the resulting increased density of devices will require an increasing number of interconnections within a chip, or interconnections between chips in a multi-chip design.

Transistors or gates typically make up a circuit cell. Each cell of an integrated circuit includes a plurality of points, sometimes referred to as pins or terminals, each of which must be connected to pins of other cells by an electrical interconnect wire network or net. Cells may comprise individual logic gates or, more preferably, may each comprise a plurality of gates or transistors that are interconnected to form functional blocks. It is desirable to attempt to optimize a design so that the total wire length and interconnect congestion are minimized.

As the number of transistors on a single chip becomes very large, gains made in reducing the feature size brought on by advances in fabrication technology may be offset by the increased area required for interconnection. As the number of interconnections increase, the amount of real estate on the semiconductor die occupied by interconnections could become relatively large unless steps are taken to improve conventional layout techniques.

In early days of large scale integration, only a single layer of metal was available for routing, and polysilicon (polycrystalline silicon) and a single such metal layer were used to complete the interconnections. The first metal layer may be referred to as the "metal 1" layer or "M1" layer. As semiconductor fabrication processes improved, a second metal layer was added. The second metal layer may be referred to as the "metal 2" layer or "M2" layer.

The performance of a chip depends on the maximum wire length of the interconnection metal used. For better performance, it is desirable to minimize the maximum wire length. As the feature size is made smaller, the delay per unit length of interconnection increases.

The performance of a chip is bound by the time required for computation by the logic devices and the time required for the data communication. In the past, the time required for data communication was typically insignificant compared to the time required for computation, and could be neglected. In the past three decades, there has been a significant improvement in the average speed of computation time per gate. Now, the interconnection delays are on the order of gate delays and as a result, have become significant and can no longer be ignored. Interconnect delays are an increasing percentage of path delay.

When two points are interconnected by metal, a connection is formed which may be referred to as a wire or a conductor. When two wires in the same metal layer run parallel to each other, parasitic capacitances may be significant and "crosstalk" may occur between signals on those wires. The metal 1 layer is typically separated from the metal 2 layer by a dielectric. When only two metal layers were used, a rectangular or rectilinear approach to routing provided metal 1 wires at 90 degrees relative to metal 2 wires, and this gave satisfactory results in many instances. However, a rectangular approach to routing when three metal layers are available has provided metal 3 wires parallel to metal 1 wires, and these metal layers are separated by layers of dielectric. This has resulted in unsatisfactory capacitance and "crosstalk" in many instances. With four metal layers, metal layers M1 and M3 may have parallel wires, and metal layers M2 and M4 may have parallel wires or conductors. Significant performance degradation may result.

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

Typically, the layout is then checked to ensure that it meets all of the design requirements. The result is a set of design files in a particular unambiguous representation known as an intermediate form that describes the layout. The design files are then converted into pattern generator files that are used to produce patterns by an optical or electron beam pattern generator that are called masks.

During fabrication, these masks are used to pattern a silicon wafer using a sequence of photolithographic steps. This component formation requires very exacting details about geometric patters and separation between them. These details are expressed by a complex set of design rules. The process of converting the specifications of an electrical circuit into a layout is called the physical design. It is an extremely tedious and an error-prone process because of the tight tolerance requirements, the complexity of the design rules, and the minuteness of the individual components.

Currently, the geometric feature size of a component is on the order of 0.5 microns. However, it is expected that the feature size can be reduced to 0.1 micron within several years. This small feature size allows fabrication of as many as 4.5 million transistors or 1 million gates of logic on a 25 millimeter by 25 millimeter chip. This trend is expected to continue, with even small feature geometries and more circuit elements on an integrated circuit, and of course, larger die (or chip) sizes will allow far greater numbers of circuit, elements.

As stated above, each microelectronic circuit cell includes a plurality of pins or terminals, each of which must be connected to the pins of other cells by a respective electrical interconnect wire network or net. A goal of the optimization process is to determine a cell placement such that all of the required interconnects can be made, and the total wirelength and interconnect congestion are minimized. A goal of routing is to minimize the total wirelength of the interconnects, and also to minimize routing congestion. Achievement of this goal is restricted using conventional rectilinear routing because diagonal connections are not possible. Rarely are points to be connected located in positions relative to each other such that a single straight wire segment can be used to interconnect the points. Typically, a series of wire segments extending in orthogonal directions have been used to interconnect points. A diagonal path between two terminals in shorter than two rectilinear orthogonal paths that would be required to accomplish the same connection. Another drawback of conventional rectilinear interconnect routing is its sensitivity to parasitic capacitance. Since many conductors run in the same direction in parallel with each other, adjacent conductors form parasitic capacitances that can create signal crosstalk and other undesirable effects.

As illustrated in FIG. 1, a conventional microelectronic integrated circuit 93 comprises a substrate 95 on which a large number of semiconductor devices are formed. These devices include large functional macroblocks such as indicated at 94 which may be central processing units, input-output devices or the like. Many designers have a cell library consisting of standardized cells that perform desired logical operations, and which may be combined with other cells to form an integrated circuit having the desired functionality. A typical integrated circuit further comprises a large number of smaller devices such as logic gates 96 which are arranged in a generally rectangular patter in the areas of the substrate 95 that are not occupied by macroblocks.

The logic gates 96 have terminals 98 to provide interconnections to other gates 96 on the substrate 95. Interconnections are made via vertical electrical conductors 97 and horizontal electrical conductors 99 that extend between the terminals 98 of the gates 96 in such a manner as to achieve the interconnections required by the netlist of the integrated circuit 93. It will be noted that only a few of the elements 96, 98, 97 and 99 are designated by reference numerals for clarity of illustration.

In conventional integrated circuit design, the electrical conductors 97 and 99 are formed in vertical and horizontal routing channels (not designated) in a rectilinear (Manhattan) pattern. Thus, only two directions for interconnect routing are provided, although several layers of conductors extending in the two orthogonal directions may be provided to increase the space available for routing.

A goal of routing is to minimize the total wirelength of the interconnects, and also to minimize routing congestion. Achievement of this goal is restricted using conventional rectilinear routing because diagonal connections are not possible. A diagonal path between two terminals is shorter than two rectilinear orthogonal paths that would be required to accomplish the same connection.

Another drawback of conventional rectilinear interconnect routing is its sensitivity to parasitic capacitance. Since many conductors run in the same direction in parallel with each other, adjacent conductors form parasitic capacitances that can create signal crosstalk and other undesirable effect.

However, as the number of transistors on a die continues to increase, more metal layers are needed to connect the terminals of the transistors. But, as discussed above, conventional rectilinear routing suffers from many problems. Therefore, new methods of routing multiple metal layers are needed.

SUMMARY OF THE INVENTION

It is an object of the present invention to address the foregoing problem by utilizing multiple layers of conductors that are routed both orthogonally and non-orthogonally to each other.

According to an embodiment of the invention, hexadecagonal routing uses eight metal layers to connect the terminals of cells in an integrated circuit. The conductors in the metal layers are routed both orthogonally and non-orthogonally to each other. Non-orthogonally routed conductors have slopes that are ratios of non-zero integers which approximate ceratin predetermined angles. The integers in the ratios are chosen from integers generated by sequence equations.

The conductors are routed by following grid lines in a grid system comprising both orthogonal grid lines and non-orthogonal grid lines having slopes generated by the sequence equations. Ratios of integers are used to approximate certain angles so that the conductors would intersect the cell terminals located on the fundamental grid intersection points. The conductors in different metal layers form different angles with other conductors in other metal layers based on the slopes of the conductors.

Other features and advantages of the invention will become apparent from the following detailed description, taken in conjunction with the accompanying drawings which illustrate, by way of example, various features of embodiments of the invention.

BRIEF DESCRIPTION OF THE DRAWINGS

FIG. 1 (Prior Art) is a simplified illustration of an integrated circuit chip on semiconductor material.

FIG. 1a is a simplified illustration of a cross-sectional view of an integrated circuit die which includes four metal layers.

FIG. 2 illustrates the geometry of eight metal layers routing according to preferred embodiments of the present invention.

FIG. 3 illustrates a fundamental reference grid system used for designing and placing cells in integrated circuits in accordance with embodiments of the present invention.

FIG. 4 illustrates a grid system used to route the M1 and M2 metal layers in accordance with preferred embodiments of the present invention.

FIG. 5 illustrates a grid system used to route the M3 and M4 metal layers in accordance with an embodiment of the present invention.

FIG. 5a illustrates a grid system used to route the M3 and M4 metal layers in accordance with another embodiment of the present invention.

FIG. 5b illustrates a grid system used to route the M3 and M4 metal layers in accordance with another embodiment of the present invention.

FIG. 6 illustrates a grid system used to route the M5 and M6 metal layers in accordance with an embodiment of the present invention.

FIG. 6a illustrates a grid system used route the M5 and M6 metal layers in accordance with another embodiment of the present invention.

FIG. 7 illustrates a grid system used to route the M7 and M8 metal layers in accordance with an embodiment of the present invention.

FIG. 7a illustrates a grid system used to route the M7 and M8 metal layers in accordance with another embodiment of the present invention.

FIG. 7b illustrates a grid system used to route the M7 and M8 metal layers in accordance with another embodiment of the present invention.

FIG. 7c illustrates a grid system used to route the M7 and M8 metal layer in accordance with another embodiment of the present invention.

FIG. 8 illustrates grid systems used to route the metal layers superimposed on each other in accordance with preferred embodiments of the present invention.

FIG. 9 illustrates an enlarged view of the center of FIG. 8.

FIG. 10 illustrates grid systems used to route the metal layers superimposed on each other in accordance with another embodiment of the present invention.

FIG. 11 illustrates an enlarged view of the center of FIG. 10.

FIG. 12 illustrates the geometry of six metal layers routing in accordance with a preferred embodiment of the present invention.

FIG. 13 illustrates a grid system used to route the M1 and M2 metal layers in accordance with a preferred embodiment of the present invention.

FIG. 14 illustrates a grid system used to route the M3 and M4 metal layer in accordance with a preferred embodiment of the present invention.

FIG. 14a illustrates a grid system used to route the M3 and M4 metal layers in accordance with another embodiment of the present invention.

FIG. 15 illustrates a grid system used to route the M5 and M6 metal layers in accordance with a preferred embodiment of the present invention.

FIG. 15a illustrates a grid system used to route the M5 and M6 metal layers in accordance with another embodiment of the present invention.

FIG. 16 illustrates grid systems used to route the metal layers superimposed on each other in accordance with a preferred embodiment of the present invention.

FIG. 17 illustrates an enlarged view of the center of FIG. 16.

FIG. 18 shows grid systems used to route the metal layers superimposed on each other in accordance with another embodiment of the present invention.

FIG. 19 shows an enlarged view of the center of FIG. 18.

FIG. 20 illustrates the geometry of five metal layers routing in accordance with a preferred embodiment of the present invention.

FIG. 21 illustrates the geometry of four metal layers routing in accordance with a preferred embodiment of the present invention.

FIG. 22 illustrates a grid system used to route the M1, M2, M3 and M4 metal layers in accordance with a preferred embodiment of the present invention.

FIG. 23 illustrates a grid system used to route the M1, M2, M3 and M4 metal layers in accordance with another embodiment of the present invention.

FIG. 24 illustrates the geometry of five metal layer routing in accordance with a preferred embodiment of the present invention.

FIG. 25 illustrates a grid system used to route the M1 and M2 metal layers in accordance with a preferred embodiment of the present invention.

FIG. 26 illustrates a grid system used to route the M4 and M5 metal layers in accordance with a preferred embodiment of the present invention.

FIG. 27 illustrates a grid system used to route the M4 and M5 metal layers superimposed on the fundamental grid in accordance with an embodiment of the present invention.

FIG. 28 illustrates a general purpose computer system in accordance with the present invention.

DESCRIPTION OF THE PREFERRED EMBODIMENT(S)

FIG. 1a provides a simplified cross-sectional view of a typical integrated circuit chip (or die) 50. As shown in FIG. 1a, chip 50 includes a semiconductor substrate 59, metal layers 51 to 54, electrically insulating layers 56, and passivation layer 58. Semiconductor substrate 59, which is typically polysilicon, is used for forming the transistors and other electronic devices.

Metal layers 51 to 54 may be formed from any of a variety of materials including aluminum, copper or an electrically conductive alloy. Between metal layers 51 and 52, 52 and 53, and 53 and 54, and between metal layers 51 and substrate 59 is an electrically insulating layer 56, which typically is formed as an oxide film. Connections between any of metal layers 51 to 54 and semiconductor substrate 59 are made using interlayer holes called vias. Passivation layer 58 functions to prevent the deterioration of the electrical properties of the die caused by water, ions and other external contaminants, and typically is made of a scratch-resistant material such as silicon nitride and/or silicon dioxide.

A. Hexadecagonal Routing

FIG. 2 illustrates the geometry of the eight metal layers routing according to preferred embodiments of the present invention. In preferred embodiments of the present invention, the paths or the slopes formed by the eight metal layers are approximately parallel to the sixteen sides of an equilateral hexadecagon. In an equilateral hexadecagon, each of the sixteen sides form an angle of 22.5 degrees with its adjacent sides.

FIG. 3 illustrates a fundamental reference square grid system 100 used for designing and placing the cells in integrated circuits in accordance with embodiments of the present invention. All levels of the circuit design are based on the fundamental reference square grid system 100, including cell placement and cell design. As shown in FIG. 3, the fundamental reference square grid system 100 (hereinafter "fundamental grid 100") resembles a typical Cartesian Y-axis and X-axis coordinate grid system in which the Y-axis and the X-axis are perpendicular to each other. The fundamental grid 100 serves as the reference grid system for all other grid systems that are presented below. All grid distances are based on the fundamental grid 100. In preferred embodiments, since most of the cell terminals align with the grid intersection points such as an intersection point 111, it is important for the metal layer routings to intersect the grid intersection points and obey the design rules at the same time. In other words, the metal layer routings should intersect the grid intersection points as much as possible so that the routings may also intersect the cell terminals which are located at the grid intersection points. However, vias formed between the metal layers can be formed anywhere the conductors in different metal layers cross, not just at the predefined grid intersection points.

As shown in FIGS. 2 and 4, conductors in a first metal layer (M1) 101 form vertical paths like the Y-axis, and conductors in a second metal layer (M2) 102 form horizontal paths perpendicular to the conductors in the M1 101 layer like the X-axis. Conductors in both the M1 101 and M2 102 layers are at least one grid spacing apart in order to obey the IC design rules. Therefore, the routings of the M1 101 and M2 102 layers follow the lines of the fundamental grid 100. Consequently, the M1 101 and M2 102 metal layers uses a grid system 120, shown in FIG. 4, which is equivalent to the fundamental grid 100 for routing the conductors that connect the terminals of the cells in the IC. Lines 121 in the grid system 120 lay out the paths for the routings in the M1 101 layer, and lines 220 lay out the paths for the routings in the M2 202 layer. The pitch, which is the closest distance between the adjacent lines in the grid system, is one grid (based on the fundamental grid 100). All grid spacings are based on the grids of the fundamental grid 100. All routings in the M1 101 and M2 102 layers follow the paths laid out by the lines 121 and 122 in the grid system 120.

As shown in FIG. 2, the conductors in a third metal layer (M3) 103 form a 45 degrees angle with the conductors in the M2 102 layer. The conductors in the M3 103 layer have a positive slope when they are superimposed on the fundamental grid 100. In contrast, the conductors in a fourth metal layer (M4) 104 form a 135 degrees angle with the conductors in the M2 102 layer or equivalently form a 45 degrees angle with the conductors in the M1 101 layer. Thus, the conductors in the M4 104 layer have a negative slope when they are superimposed on the fundamental grid 100. The conductors in the M3 103 and M4 104 layers are perpendicular to each other.

FIG. 5 illustrates a grid system 130 used by the M3 103 and M4 104 layers in accordance with an embodiment of the present invention. Lines 131 in the grid system 130 lay out the paths for the routings in the M3 103 layer, and lines 132 lay out the paths for the routing in the M4 104 layer. The slope for the lines 131 is one, which means that the lines 131 follow the "right one grid, then up one grid" construction rule forming an angle of arctan(1/1)=45.0 degrees with the lines 122 for the M2 102 layer. In contrast, the slope for the lines 132 is negative one, which means that the lines 132 follow the "right one grid, then down one grid" construction rule making an angle of arctan(-1/1)=-45.0 degrees with the lines 122. Therefore, the lines 131 and 132 are perpendicular to each other.

The intersection points for lines 131 with the X-axis are 1½ grids apart which means that for each of the lines 131, the next lines passes 1½ grids to the right or 1½ grids to the left of the first line on the X-axis. In other words, each of the lines 131 intersect the X-axis 1½ girds apart from each other, as shown in FIG. 5. The same fact also applies to the lines 132. Therefore, the pitch for the grid system 130 is a 3√2/4=1.06066 grids which is around 6% more than the grid system 120. Since the pitch is greater than one, the grid system 130 obeys the design rule which dictates that every metal layer conductors or routings need to be at least 1 grid apart.

In certain embodiments of the present invention, the intersection points on the X-axis for the lines 131 and 132 are 1⅖ grids apart which means that the lines pass 1⅖ grids to the right or to the left of each other, resulting in a pitch of 7√2/10=0.98995 grid, as shown by a grid system 130a in FIG. 5a. Since the pitch is less than one, the grid system 130a can only be used if the design rule is flexible enough to allow a pitch slightly below one. In other embodiments of the present invention, the lines 131 and 132 pass 1 3/7 grids to the right or to the left of each other, resulting in a pitch of 5*sqrt(2)/7=1.01015 grids, as shown by a grid system 130b in FIG. 5b. Since the pitch in the grid system 130b is greater than one grid by around 1%, the grid system 130b obeys the design rules. Any one of the grid systems 130, 130a and 130b may be used to route the conductors on the metal layers M3 103 and M4 104.

Referring back to FIG. 2, the conductors in a fifth metal layer (M5) 105 form an angle of approximately 22.5 degrees with the conductors in the M2 102 layer. The conductors in the M5 105 layer do not form an exact 22.5 degrees angle with the X-axis or the conductors in the M2 102 layer like an equilateral hexadecagon for the following reason: If the conductors in the M5 105 layer formed an exact 22.5 degrees angle with the X-axis or the conductors in the M2 102 layer, the conductors in the M5 105 layer would not intersect the grid intersection points on the fundamental grid 100. Consequently, if the conductors in the M5 105 layer cannot intersect the grid intersection points on the fundamental grid 100, the conductors in the M5 105 layer would not be able to intersect cell terminals located on the grid intersection points, resulting in an inability to connect cell terminals together. Therefore, the angle for the M5 105 layer is approximately 22.5 degrees, not exactly 22.5 degrees, so that the M5 105 layer conductors can intersect the cell terminals located at the grid intersection points and connect the terminals together. The same logic applies to conductors in other metal layers such as metal layers M6, M7 and M8. The conductors in the M5 105 layer have a positive slope when they are superimposed on the fundamental grid 100.

Similarly, as shown in FIG. 2, the conductors in a sixth metal layer (M6) 106 form an angle of approximately 112.5 degrees with the conductors in the M2 102 layer or, equivalently, form an angle of approximately 22.5 degrees with the conductors in the M1 101 layer. As discussed above, the M6 layer does not form an exact 22.5 degrees angle for the same reason as the M5 105 layer. The conductors in the M6 106 layer have a negative slope when they are superimposed on the fundamental grid 100. The conductors in the M5 and M6 layers are perpendicular to each other.

FIG. 6 illustrates a grid system 140 used by the M5 105 and M6 106 layers in accordance with certain embodiments of the present invention. Lines 141 in the grid system 140 lay out the paths for the routings in the M5 105 layer, and the lines 142 layout the paths for the routings in the M6 106 layer. The slope for the lines 141 is ⅖, which means that the lines 141 follow the "right five grids, then up two grids" construction rule making an angle of arctan(⅖)=21.80141 degrees with the lines 122 for the M2 102 layers. In contrast, the slope for the lines 142 is -(5/2), which means that the lines 142 follow the "right two grid, then down five grid" construction rule making an angle of arctan(-5/2)=-68.19859 degree with the lines 122. In other words, the lines 142 form an angle of 21.80141 degrees with the vertical lines 121. Therefore, lines 141 and 142 are perpendicular to each other. So, basically, the lines 141 and 142 form slopes which are ratios of integer values that will approximate 22.5 degrees of an hexadecagon so that the conductors in the M5 and M6 layers would intersect the grid intersection points, as discussed above.

The value of 21.80141 degrees is very close to the value of 22.5 degrees for an equilateral hexadecagon. However, as discussed above, the value of arctan(⅖) is used instead of 22.5 degrees, so that the M5 105 and M6 106 layers conductors would intersect the cell terminal points located at the grid intersection points of the fundamental grid 100.

FIG. 6a illustrates a grid system 140a used by the M5 105 and M6 106 layers in accordance with other embodiments of the present invention. Lines 141a in the grid system 140a lay out the paths for the routings in the M5 105 layer, and the lines 142a lay out the paths for the routings in the M6 106 layer. The slope for the lines 141a is 5/12, which means that the lines 410a follow the "right twelve grids, then up five grids" construction rule making an angle of arctan(5/12)= 22.61986 degrees with the lines 220 for the M2 102 layer. In contrast, the slope for the lines 142a is -(12/5), which means that the lines 142a follow the "right five grids, then down twelve grids" construction rule making an angle of arctan (-12/5)=-67.38014 degree with the lines 122. In other words, the lines 142a form an angle of 22.61986 degrees with the vertical lines 121 for the M1 101 layer. Therefore, lines 141a and 142a are perpendicular to each other.

The value of 22.61986 degrees is very close to the value of 22.5 degrees for an equilateral hexadecagon. However, as discussed above, the value of arctan (5/12) is used instead of 22.5 degrees, so that the M5 105 and M6 106 conductors would intersect the cell terminal points located at the grid intersection points on the fundamental grid 100.

The above ratios 2:5 and 5:12 used to approximate 22.5 degrees of an equilateral hexadecagon is derived from the following approximation schemes. However, before the approximation schemes are discussed, it is pointed out that ratios of integer values are needed to approximate the 22.5 degrees because the conductors or the routings in the metal layers need to intersect grid intersection points on the fundamental grid 100 in order to connect the cell terminals located on the grid intersection points. Therefore, the conductors need to move at a slope or an angle that is a ratio of integer values in order to intersect the grid intersection points which fall on integer values. If the conductors moved at a slope which is a ratio of non-integer values, the conductors would not intersect the grid intersection points. For example, if conductors in the M5 105 layer actually moved at an angle of 22.5 degrees, the M5 105 layer conductors would not intersect the grid intersection points. Thus, the following approximation schemes are used to find integer ratios that would approximate 22.5 degrees of an equilateral hexadecagon.

First, it is recognized that $\tan(\pi/8) = \tan 22.5$ degrees $= \text{sqrt}(2) - 1 = 0.41421$. The ratios of 2/5 and 5/12 are equal to 0.400 and 0.41667, respectively. The previous ratios are generated by the following sequence: $a[n]:b[n]$ where $a[n+1]=b[n]$ and $b[n+1]=a[n]+2*b[n]$. In the limit as $n \to \infty$, the ratio $a[n]/b[n] = \text{sqrt}(2)-1$.

$$\text{Let } S = \lim_{n \to \infty} \frac{a[n]}{b[n]}, \text{ then } S \frac{a}{b} \frac{b}{a+2b} \frac{1}{S+2} \text{ so } S*(S+2) = 1.$$

By using the quadratic formula, $S=\text{sqrt}(2)-1$. Table T1 below lists some of the sequences.

| n | a[n] | b[n] |
|---|------|------|
| 1 | 1    | 2    |
| 2 | 2    | 5    |
| 3 | 5    | 12   |
| 4 | 12   | 29   |
| 5 | 29   | 70   |
| 6 | 70   | 169  |

Another table T2 can be constructed by using the same sequence.

| n | a[n] | b[n] |
|---|------|------|
| 1 | 1    | 1    |
| 2 | 1    | 3    |
| 3 | 3    | 7    |
| 4 | 7    | 17   |
| 5 | 17   | 41   |
| 6 | 41   | 99   |

The intersection points for the lines 141 with the X-axis are 3 grids apart which means that for each of the lines 141, the adjacent lines pass 3 grids to the left and right or 1⅕ grids above and below. Therefore, the pitch for the lines 141 is $6/\text{sqrt}(29)=1.11417$ grids which is around 11% more than the grid system 120. Since the pitch is greater than one, the lines 141 obey the design rule which dictates that every metal layer conductors need to be at least 1 grid apart.

The intersection points for lines 142 with the X-axis are 1⅕ grids apart which means that for each of the lines 142, the adjacent lines pass 1⅕ grids to the left and right or 3 grids above and below. Therefore, the pitch for the lines 142 is also $6/\text{sqrt}(29)=1.11417$ grids.

The intersection points for lines 141a with the X-axis are 2⅗ grids apart which means that for each of the lines 141a, the adjacent lines pass 2⅗ grids to the left and right or 1 1/12 grids above and below. Therefore, the pitch for the lines 141 is $13/\text{sqrt}(169)=1.0000$ grid which is equal to the grid system 120. Since the pitch is equal to one, the lines 141a obey the design rule.

The intersection points for lines 142a with the X-axis are 1 1/12 grids apart which means that for each of the lines 142a, the adjacent lines pass 1 1/12 grids to the left and right or 2⅗ grids above and below. Therefore, the pitch for the lines 142a is also $13/\text{sqrt}(169)=1.0000$ grid which is exactly same as the fundamental grid 100 or the grid system 120. Since the pitch is equal to one, the lines 142a obey the design rule.

Any one of the grid systems 140 and 140a may be used to route the conductors on the metal layers M5 105 and M6 106.

Referring back to FIG. 2, the conductors in a seventh metal layer (M7) 107 form an angle of approximately 157.50 degrees or -22.5 degrees with the conductors in the M2 102 layer. Similar to the M5 105 and M6 106 layers, the conductors in the M7 107 layer do not form an exact 157.50 or -22.5 degrees with the X-axis. As discussed above, if the conductors in the M7 107 layer formed an exact -22.5 degrees with the X-axis or the conductors in the M2 layer, the conductors in the M7 107 layer would not intersect the grid intersection points on the fundamental grid 100. The conductors in the M7 107 layer have a negative slope when they are superimposed on the fundamental grid 100.

Similarly, as shown in FIG. 2, the conductors in an eighth metal layer (M8) 108 form an angle of approximately 67.5 degrees with the conductors in the M2 102 layer or, equivalently, form an angle of approximately 22.5 degrees with the conductors in the M1 101 layer. As discussed above, the M8 108 layer does not form an exact 67.5 degree for the same reason as the M7 107 layer. The conductors in the M8 108 layer have a positive slope when they are superimposed on the fundamental grid 100. The conductors in the M7 107 and M8 108 layers are perpendicular to each other.

FIG. 7 illustrates a grid system 150 used by the M7 107 and M8 108 layers in accordance with certain embodiments of the present invention. Lines 151 in the grid system 150 lay out the paths for the routings in the M8 108 layer, and the lines 152 lay out the paths for the routings in the M7 107 layer. The slope for the lines 151 is 7/3, which means that the lines 151 follow the "right three grids, then up seven grids" construction rule making an angle of arctan(7/3)=66.80141 degrees with the lines 122 for the M2 102 layers. In contrast, the slope for the lines 152 is -(3/7), which means that the lines 152 follow the "left seven grids, then up three grids" construction rule making an angle of arctan(-3/7)=-23.19859 degree with the lines 122. Therefore, lines 151 and 152 are perpendicular to each other.

The value of 23.19859 degrees is very close to the value of 22.5 degrees for an equilateral hexadecagon. However, as discussed above, the value of arctan(3/7) is used instead of 22.5 degrees, so that the M7 107 and M8 108 conductors would intersect the cell terminal points located at the grid intersection points on the fundamental grid 100.

FIG. 7a illustrates a grid system 150a used by the M7 107 and M8 108 layers in accordance with other embodiments of the present invention. Lines 151a in the grid system 150a lay out the paths for the routings in the M8 108 layer, and the lines 152a lay out the paths for the routings in the M7 107 layer. The slope for the lines 151a is $^{17}/_7$, which means that the lines 151a follow the "right seven grids, then up seventeen grids" construction rule, making an angle of arctan ($^{17}/_7$)=67.61986 degrees with the lines 122 for the M2 102 layers. In contrast, the slope for the lines 152a is $-(^{7}/_{17})$, which means that the lines 152a follow the "left seventeen grids, then up seven grids" construction rule, making an angle of arctan($-^{7}/_{17}$)=-22.38014 degree with the lines 122. Therefore, lines 151a and 152a are perpendicular to each other.

The value of 22.38014 degrees is very close to the value of 22.5 degrees for an equilateral hexadecagon. However, as discussed above, the value of arctan ($^{7}/_{17}$) is used instead of 22.5 degrees, so that the M7 107 and M8 108 conductors would intersect the cell terminal points located at the grid intersection points on the fundamental grid 100.

The ratios of 7/3 and 17/7 come from Table 2 which is derived by using the same approximation scheme as the one used to derive the ratios for the M5 105 and M6 106 layers.

The intersection points for lines 151 with the X-axis are 1½ grids apart which means that for each of the lines 151, the adjacent lines pass 1⅓ grids to the left and right or 2⅔ grids above and below. The intersection points for lines 152 with the X-axis are 2⅔ grids apart which means that for each of the lines 152, the adjacent lines pass 2⅔ grids to the left and right or 1⅓ grids above and below. Therefore, the pitch for the lines 151 and 152 is 8/sqrt(58)=1.05045 grids.

The intersection points for lines 151a with the X-axis are 1⅕ grids apart which means that for each of the lines 151a, the adjacent lines pass 1²/₁₇ grids to the left and right or 2⁵/₇ grids above and below. The intersection points for lines 152a with the X-axis are 2⁵/₇ grids apart which means that for each of the lines 152a, the adjacent lines pass 2⁵/₇ grids to the left and right or 1²/₁₇ grids above and below. Therefore, the pitch for the lines 151a and 152a is 19/sqrt(358)=1.03346 grids. Since the pitch is greater than one, the lines 151a and 152a obey the design rule.

FIGS. 7b and 7c illustrate grid systems 150b and 150c to be used for the metal layers M7 107 and M8 108 in accordance with other embodiments of the present invention. The grid systems 150b and 150c use the ratios of 5/2 and 17/7 for the arctan angles, respectively, resulting in angles of 68.19859 and 67.61986 degrees. The pitch for the grid system 150b is 1.11417 grids, and the pitch for the grid system 150c is 0.97907 grid. Since the pitch for the grid system 150c is below one, the design rule must be able to tolerate the difference.

Any one of the grid systems 150, 150a, 150b and 150c may be used to route the conductors on the metal layers M7 107 and M8 108.

The following Table 3 summarizes the grid systems described above for the metal layers M1–M8.

| Grid System | Angle Tangent | FIG. | Grid Pitch | Angle Degrees |
|---|---|---|---|---|
| 120 | Zero | 4 | 1.00000 | Zero |
| 130 | 1/1 | 5 | 1.06066 | 45 |
| 130a | 1/1 | 5a | 0.98995 | 45 |
| 130b | 1/1 | 5b | 1.01015 | 45 |
| 140 | 2/5 | 6 | 1.11417 | 21.80141 |
| 140a | 5/12 | 6a | 1.00000 | 22.61986 |
| 150 | 7/3 | 7 | 1.05045 | 66.80141 |
| 150a | 17/7 | 7a | 1.03346 | 67.61986 |
| 150b | 5/2 | 7b | 1.11417 | 68.19859 |
| 150c | 17/7 | 7c | 0.97907 | 67.61986 |

FIG. 8 shows the grid systems 120, 130, 140 and 150 superimposed on each other. In accordance with a preferred embodiment of the present invention, the grid systems 120, 130, 140 and 150 are used to route the conductors in the metal layers M1–M8. Near the center of FIG. 8, a grid intersection point 160 is shown. The grid intersection point 160 is intersected by two grid lines from each of the grid systems 120, 130, 140 and 150. In other words, the grid intersection point 160 is intersected by one grid line for the metal layer M1 101, one grid line for the metal layer M2 102, one grid line for the metal layer M3 103, and so on. One grid line from each of the metal layers M1–M8 intersect each other at the grid intersection point 160. A pattern similar to a hexadecagon is formed around the grid intersection point 160. Other grid intersection points 160a, 160b, 160c and 160d are also intersected by one grid line from each of the metal layers M1–M8. The pattern of the eight superimposed grid lines (such as the point 160) repeats by moving "six grid right, then six grids up," or "six grids left, then six grids down," or "six grids right, then six grids down" or "six grids left, then six grids up" from any of the grid intersection points (e.g. 160, 160a, 160b, 160c, 160d) intersected by grid lines from all eight metal layers M1–M8. The following equations describe the grid lines for grid systems 120, 130, 140 and 150.

n=set of all integers

Lines 121: x=n;

Lines 122: y=n;

Lines 131: y=x+(3/2)*n;

Lines 132: y=-x+(3/2)*n;

Lines 141: y=(2/5)*x+(6/5)*n;

Lines 142: y=(-5/2)*x+3*n;

Lines 151: y=(7/3)*x+(8/3)*n;

Lines 152: y=(-3/7)*x+(8/7)*n.

FIG. 9 shows an enlarged view of the center of FIG. 8. FIG. 9 has been enlarged by a factor of approximately four and shows the angles of inclination of the metal layers M1–M8. An angle A formed between the lines 122 and lines 141 has a tangent of 2/5 which yields an angle of 21.80141 for the angle A, as discussed above.

$$\tan A = 2/5;$$

Angle $A = arctan(2/5) = 21.80141$ degrees.

An angle B formed between the lines 141 and lines 131 is 23.19858 degrees. The angle B can be derived by using the following equations:

$$\tan(A+B) = 1/1;$$

$$\tan B = \tan((A+B) - A);$$
$$= \frac{\tan(A+B) - \tan A}{1 + \tan(A+B) * \tan A};$$
$$= \frac{1/1 - 2/5}{1 + 1/1 * 2/5} = \frac{3/5}{1 + 2/5} = 3/7;$$

Angle $B = arctan(3/7) = 23.19859$ degrees.

An angle C formed between the lines 131 and lines 151 is 21.80141 degrees. The angle C is derived by using the following equations:

$$\tan C = \tan((A+B+C)-(A+B));$$

$$\tan C = \frac{\tan(A+B+C)-\tan(A+B)}{1+\tan(A+B+C)*\tan(A+B)};$$

$$= \frac{7/3-1}{1+7/3} = \frac{4/3}{10/3} = \frac{4}{10} = 2/5;$$

Angle $C=\arctan(2/5)=21.80141$ degrees.

The angle C is exactly equal to the angle A as indicated on FIG. 9.

An angle D formed between the lines 151 and lines 121 is equal to 23.19859 degrees.

$$\tan D = 3/7;$$

Angle $D=\arctan(3/7)=23.19859$ degrees.

An angle E formed between the lines 121 and 142 is equal to 21.80141 degrees. The angle E is derived by the following equations:

$$\tan E = 2/5;$$

Angle $E=\arctan(2/5)=21.80141$ degrees.

An angle F formed between the lines 142 and lines 132 is equal to 23.19859 degrees and is derived by the following equations:

$$\tan F = \tan((E+F)-E);$$

$$= \frac{\tan(E+F)-\tan E}{1+\tan(E+F)*\tan E};$$

$$= \frac{1-2/5}{1+1*2/5} = \frac{3/5}{7/5} = 3/7;$$

$$\tan F = 3/7;$$

Angle $F=\arctan(3/7)=23.19859$ degrees.

An angle G formed between the lines 132 and 152 is equal to 21.80141 degrees and is derived by the following equations:

$$\tan G = \tan((E+F+G)-(E+F));$$

$$= \frac{\tan(E+F+G)-\tan(E+F)}{1+\tan(E+F+G)*\tan(E+F)};$$

$$= \frac{7/3-1}{1+7/3*1} = \frac{4/3}{10/3} = \frac{4}{10} = 2/5;$$

$$\tan G = 2/5;$$

Angle $G=\arctan(2/5)=21.80141$ degrees.

An angle H formed between the lines 152 and lines 122 is equal to 23.19859 degrees and is derived by the following equations:

$$\tan H = 3/7;$$

Angle $H=\arctan(3/7)=23.19859$ *degrees.*

The following summarizes all angle A–H.

Angle A=Angle C=Angle E=Angle G=arctan(2/5)= 21.80141 degrees

Angle B=Angle D=Angle F=Angle H=arctan(3/7)= 23.19859 degrees

The above eight angles add up to 180 degrees.

Angle A=21.80141 degrees

Angle B=23.19859 degrees

Angle C=21.80141 degrees

Angle D=23.19859 degrees

Angle E=21.80141 degrees

Angle F=23.19859 degrees

Angle G=21.80141 degrees

Angle H=23.19859 degrees

Sum=180.00000 degrees

The above eight angles are reasonably close to the ideal angle of 22.5 degrees for all eight angles. It is clear by this construction that these angles add up to 45 degrees in adjacent pairs:

Angle A+Angle B=45 degrees, exactly

Angle B+Angle C=45 degrees, exactly

Angle C+Angle D=45 degrees, exactly

Angle D+Angle E=45 degrees, exactly

Angle E+Angle F=45 degrees, exactly

Angle F+Angle G=45 degrees, exactly

Angle G+Angle H=45 degrees, exactly

Angle H+Angle A=45 degrees, exactly

All eight of the above equations are true because the trigonometric identity for the tangent of the sum of two angles yields the arithmetic equality $$2/5+3/7=1-2/5*3/7$$

representing the trigonometric relation $$\tan A + \tan B = 1 - \tan A * \tan B$$

proving that Angle A+Angle B=45 degrees, exactly.

For completeness here are the tangents of the sums of these angles:

$$\tan(A)=2/5$$

$$\tan(A+B)=1/1$$

$$\tan(A+B+C)=7/3$$

$$\tan(A+B+C+D)=infinity$$

$$\tan(A+B+C+D+E)=-5/2$$

$$\tan(A+B+C+D+E+F)=-1/1$$

$$\tan(A+B+C+D+E+F+G)=-3/7$$

$$\tan(A+B+C+D+E+F+G+H)=zero$$

FIG. 10 shows the grid systems 120, 130*a*, 140*a* and 150*a* superimposed on each other. In accordance with another embodiment of the present invention, the grid systems 120, 130*a*, 140*a* and 150*a* are used to route the conductors in the metal layers M1–M8. Near the center of FIG. 10, a grid intersection point 170 is shown. Similar to the grid intersection point 160, the grid intersection point 170 is intersected by two grid lines from each of the grid systems 120, 130*a*, 140*a* and 150*a*. In other words, the grid intersection point 170 is intersected by one grid line for the metal layer M1, one grid line for the metal layer M2, one grid line for the metal layer M3, and so on. One grid line from each of the metal layers M1–M8 intersect each other at the grid intersection point 170. A pattern similar to a hexadecagon is formed around the grid intersection point 170. Another grid intersection point similar to the grid intersection point 170 will occur 1729 grids above the grid intersection point 170 for the following reason. The least common denominator of the intercepts of the eight grid lines intercepting the grid intersection point 700 is 17*12*7*5=7140. Thus, the least common multiple of the new renormalized numerator is 19*17*13*12*49*5, so their quotient=19*17*13*12*49*5/7140=1729.

The following equations describe the grid lines for grid systems 120, 130a, 140a and 150a.

n=set of all integers

Lines 121: x=n;

Lines 122: y=n;

Lines 131a: y=x+(7/5)*n;

Lines 132a: y=-x+(7/5)*n;

Lines 141a: y=(5/12)x+(13/12)*n;

Lines 142a: y=(-12/5)x+(13/5)*n;

Lines 151a: y=(17/7)x+(19/7)*n;

Lines 152a: y=(-7/17)x+(19/17)*n;

FIG. 11 shows an enlarged view of the center of FIG. 10. FIG. 11 has been enlarged by a factor of approximately four and shows the angles of inclination I–P of the metal layers M1–M8. The angles I–P have been derived by using the trigonometrical equations used to derive the angles A–H. The following summarizes the angles I-P.

Angle I formed between the lines 122 and the lines 141a=22.61986 degrees

Angle J formed between the lines 141a and the lines 131a=22.38014 degrees

Angle K formed between the lines 131a and the lines 151a=22.61986 degrees

Angle L formed between the lines 151a and the lines 121=22.38014 degrees

Angle M formed between the lines 121 and the lines 142a=22.61986 degrees

Angle N formed between the lines 142a and the lines 132a=22.38014 degrees

Angle O formed between the lines 132a and the lines 152a=22.61986 degrees

Angle P formed between the lines 152a and the lines 122=22.38014 degrees

Sum=180.00000 degrees

Angle I=Angle K=Angle M=Angle O=arctan(5/12)=22.61986 degrees

Angle J=Angle L=Angle N=Angle P=arctan(7/17)=22.38014 degrees

Angle I+Angle J=45 degrees, exactly

Angle J+Angle K=45 degrees, exactly

Angle K+Angle L=45 degrees, exactly

Angle L+Angle M=45 degrees, exactly

Angle M+Angle N=45 degrees, exactly

Angle N+Angle O=45 degrees, exactly

Angle O+Angle P=45 degrees, exactly

Angle P+Angle I=45 degrees, exactly

Dodecagonal Routing

FIG. 12 illustrates the geometry of the six metal layers routing according to preferred embodiments of the present invention. In preferred embodiments of the present invention, the paths or the slopes formed by the six metal layers are approximately parallel to the twelve sides of an equilateral dodecagon. In an equilateral dodecagon, each of the twelve sides form an angle of thirty degrees with its adjacent sides.

As shown in FIGS. 12 and 13, conductors in a first metal layer (M1) 201 form vertical paths like the Y-axis, and conductors in a second metal layer (M2) 202 form horizontal paths perpendicular to the conductors in the M1 201 layer like the X-axis. The conductors in both M1 201 and M2 202 layers are at least one grid spacing apart in order to obey the IC design rules. Therefore, the routings of the M1 201 and M2 202 layers follow the grid lines of the fundamental grid 100. Consequently, the M1 201 and M2 202 metal layers use a grid system 210, shown in FIG. 13, which is equivalent to the fundamental grid 100 for routing conductors that connect the terminals of the cells in the IC. Lines 211 in the grid system 210 lay out the paths for the routings in the M1 201 layer, and lines 212 lay out the paths for the routings in the M2 202 layer. The pitch for the grid system 210 is one grid. All routings in the M1 201 and M2 202 layers are based on the grid system 210 and follow the grid lines in the grid system 120.

Referring back to FIG. 12, the conductors in a metal layer M3 203 form an angle of approximately 60 degrees with the conductors in the M2 202 layer. The conductors in the M3 203 layer do not form an exact 60 degrees with the X-axis. As discussed above, if the conductors in the M3 203 layer formed an exact 60 degrees with the X-axis or the conductors in the M2 202 layer, the conductors in the M3 203 layer would not intersect the grid intersection points on the fundamental grid 100. Therefore, the angle for the M3 203 layer is approximately 60 degrees, not exactly 60 degrees, so that the M3 203 layer conductors can intersect the cell terminals located at the grid intersection points and connect the terminals together. The conductors in the M3 203 layer have a positive slope when they are superimposed on the fundamental grid 100.

Similarly, as shown in FIG. 12, the conductors in the metal layer M4 204 form an angle of approximately 150 degrees with the conductors in the M2 202 layer or, equivalently, form an angle of approximately 60 degrees with the conductors in the M1 201 layer. As discussed above, the M4 204 layer does not form an exact 150 degrees for the same reason as the M3 203 layer. The conductors in the M4 204 layer have a negative slope. The conductors in the M3 203 and M4 204 layers are perpendicular to each other.

FIG. 14 illustrates a grid system 220 used by the M3 203 and M4 204 layers in accordance with certain embodiments of the present invention. Lines 221 in the grid system 220 lay out the paths for the routings in the M3 203 layer, and the lines 222 lay out the paths for the routings in the M4 204 layer. The slope for the lines 221 is 5/3, which means that the lines 221 follow the "right three grids, then up five grids" construction rule making an angle of arctan(5/3)=59.036 degrees with the lines 212 for the M2 202 layer or an angle of 30.964 degrees with the lines 211. In contrast, the slope for the lines 220 is -(3/5), which means that the lines 222 follow the "left five grids, then up three grids" construction rule making an angle of arctan(-3/5)=-30.964 degrees with the lines 212. In other words, the lines 222 form an angle of 59.036 degrees with the vertical lines 221. Therefore, lines 221 and 222 are perpendicular to each other. The pitch of the grid system 220 is 6/sqrt(34)=1.029 grids.

The value of 30.964 degrees is very close to the value of 30 degrees for an equilateral dodecagon. However, as discussed above, the value of arctan(⅗) is used instead of 30 degrees, so that the M3 203 and M4 204 conductors would intersect the cell terminal points located at the grid intersection points of the fundamental grid 100.

FIG. 14 illustrates a grid system 220a used by the M3 203 and M4 204 layers in accordance with other embodiments of the present invention. Lines 221a in the grid system 220a lay out the paths for the routings in the M3 203 layer, and the lines lay out the paths for the routings in the M4 204 layer. The slope for the lines 221a is 7/4, which means that the lines 221a follow the "right four grids, then up seven grids" construction rule making an angle of arctan(7/4)=60.255 degrees with the lines 212 for the M2 202 layers or an angle of 29.745 degrees with the lines 211. In contrast, the slope for the lines 222a is -(4/7), which means that the lines 222a follow the "left seven grids, then up four grids" construction rule making an angle of arctan(4/7)=-29.745 degrees with the lines 212. In other words, the lines 222 form an angle of 60.255 degrees with the vertical lines 221. Therefore, lines 221a and 222a are perpendicular to each other. The pitch of the grid system 220a is 8/sqrt(65)=0.9922 grid which is below the one grid minimum dictated by the design rules. Thus, the design rule must be flexible to allow for the difference.

Referring back to FIG. 12, the conductors in a metal layer M5 205 form an angle of approximately 30 degrees with the conductors in the M2 202 layer. The conductors in the M5 205 layer do not form an exact 30 degrees with the X-axis. As discussed above, if the conductors in the M5 205 layer formed an exact 30 degrees with the X-axis or the conductors in the M2 202 layer, the conductors in the M5 205 layer would not intersect the grid intersection points on the fundamental grid 100. Therefore, the angle for the M5 205 layer is approximately 30 degrees, not exactly 30 degrees, so that the M5 205 layer conductors can intersect the cell terminals located at the grid intersection points and connect the terminals together. The conductors in the M5 205 layer have a positive slope when they are superimposed on the fundamental grid 100.

Similarly, as shown in FIG. 12, the conductors in the metal layer M6 206 form an angle of approximately 120 degrees with the conductors in the M2 202 layer or, equivalently, form an angle of approximately 30 degrees with the conductors in the M1 201 layer. As discussed above, the M6 206 layer does not form an exact 120 degree for the same reason as the M5 205 layer. The conductors in the M6 206 layer have a negative slope when they are superimposed on the fundamental grid 100. The conductors in the M5 205 and M6 206 layers are perpendicular to each other.

FIG. 15 illustrates a grid system 230 used by the M5 205 and M6 206 layers in accordance with certain embodiments of the present invention. Lines 231 in the grid system 230 lay out the paths for the routings in the M5 205 layer, and the lines 232 lay out the paths for the routings in the M6 206 layer. The slope for the lines 231 is ⅗, which means that the lines 231 follow the "right five grids, then up three grids" construction rule making an angle of arctan(⅗)=30.964 degrees with the lines 212 for the M2 202 layer or an angle of 59.036 degrees with the lines 211. In contrast, the slope for the lines 232 is -(⅗), which means that the lines 232 follow the "left three grids, then up five grids" construction rule making an angle of arctan(-⅗)=-59.036 degrees with the lines 212. In other words, the lines 232 form an angle of 30.964 degrees with the vertical lines 211. Therefore, lines 231 and 232 are perpendicular to each other. The pitch of the grid system 230 is 6/sqrt(34)=1.029 grids.

FIG. 15a illustrates a grid system 230a used by the M5 205 and M6 206 layers in accordance with other embodiments of the present invention. Lines 231a in the grid system 230a lay out the paths for the routings in the M5 205 layer, and the lines 232a lay out the paths for the routings in the M6 206 layer. The slope for the lines 231a is 4/7, which means that the lines 231a follow the "right seven grids, then up four grids" construction rule making an angle of arctan(4/7)=29.745 degrees with the lines 212 for the M2 layers or an angle of 60.255 degrees with the lines 211. In contrast, the slope for the lines 232a is -(7/4), which means that the lines 1020a follow the "left four grids, then up seven grids" construction rule making an angle of arctan(-7/4)=-60.255 degrees with the lines 212. In other words, the lines 232a form an angle of 29.745 degrees with the vertical lines 221. Therefore, lines 230a and 232a are perpendicular to each other. The pitch of the grid system 230a is 8/sqrt(65)=0.9922 grid which is below the one grid minimum dictated by the design rule.

The ratios of 3/5 and 4/7 used to approximate the angle of 30 degrees of an equilateral dodecagon are derived by using the following approximation scheme.

$$a[n+1]=a[n]+b[n];$$

$$b[n+1]=3*a[n]+b[n].$$

In the limit as n→∞, the ratio a[n]/b[n]=sqrt(3)=tan(π/6)=tan 30 degrees.

$$\text{Let } S = \lim_{n \to \infty} \frac{b[n]}{a[n]}, \text{ then } S\frac{S+3}{S+1} \text{ so } S^2 = 3, \text{ hence } S = sqrt(3).$$

Table T4 below lists some of the sequences.

| n | a[n] | b[n] |
|---|------|------|
| 1 | 1    | 1    |
| 2 | 2    | 4    |
| 3 | 3    | 5    |
| 4 | 8    | 14   |
| 5 | 11   | 19   |
| 6 | 30   | 52   |

Table T4 shows the ratios $$\frac{a[3]}{b[3]} = \frac{3}{5} \text{ and } \frac{a[4]}{b[4]} = \frac{8}{14} = \frac{4}{7}$$

used to approximate sqrt(3) or tan(30 degrees).

FIG. 16 shows the grid systems 210, 220 and 230 constructed by using the 3/5 ratio superimposed on each other. In accordance with a preferred embodiment of the present invention, the grid systems 210, 220 and 230 are used to route the conductors in the metal layers M1–M6. Near the center of FIG. 16, a grid intersection point 240 is shown. The grid intersection point 240 is intersected by two grid lines from each of the grid systems 210, 220 and 230. In other words, the grid intersection point 240 is intersected by one grid line for the metal layer M1, one grid line for the metal layer M2, one grid line for the metal layer M3, and so on. [One grid line for each of the metal layers M1–M6 intersect each other at the grid intersection point 240.] A pattern similar to a dodecagon is formed around the grid intersection point 240. Other grid intersection points 240a, 240b, 240c and 240d are also intersected by one grid line from each of the metal layers M1–M6. The pattern of the six superimposed grid lines repeats by moving "three grid right, then three grids up," or "three grids left, then three grids down,"

or "three grids right, then three grids down" or "three grids left, then three grids up from any of the grid intersection points intersected by grid lines from all six metal layers M1–M6.

FIG. 17 shows an enlarged view of the center of FIG. 16. FIG. 17 shows the angle formed between the grid lines for each of the metal layers M1–M6. An angle A1 formed between the lines 212 and the lines 231 is derived by the following equations.

$$\tan A1 = 3/5;$$

Angle $A1=\arctan(3/5)=30.964$ degrees.

An angle B1 formed between the lines 231 and the lines 221 is derived as follows.

$$\tan(A1+B1)=5/3$$

$$\tan B1 = \tan((A1+B1)-A1)$$
$$= \frac{\tan(A1+B1)-\tan A1}{1+\tan(A1+B1)*\tan A1}$$
$$= \frac{5/3-3/5}{1+5/3*3/5} = \frac{16/15}{1+1} = 8/15$$

Angle $B1=\arctan(8/15)=28.072$ degrees.

An angle C1 formed between the lines 221 and the lines 211 and an angle D1 formed between the lines 211 and the lines 232 are derived as follows.

$$\tan C1 = 3/5;$$

Angle $C1=\arctan(3/5)=30.964$ degrees.

$$\tan D1 = 3/5;$$

Angle $D1=\arctan(3/5)=30.964$ degrees.

An angle E1 formed between the lines 232 and the lines 222 is derived as follows.

$$\tan E1 = \tan((D1+E1)-D1)$$
$$\tan E1 = \frac{\tan(D1+E1)-\tan D1}{1+\tan(D1+E1)*\tan D1};$$
$$\tan E1 = \frac{5/3-3/5}{1+5/3*3/5} = \frac{16/15}{1+1} = 8/15;$$

Angle $E1=\arctan(8/15)=28.072$ degrees.

Finally, an angle F1 formed between the lines 222 and the lines 212 is derived as follows.

$$\tan F1 = 3/5;$$

Angle $F1=\arctan(3/5)=30.964$ degrees.

In summary,

Angle A1=Angle C1=Angle D1=Angle F1=arctan(3/5)= 30.964 degrees.

Angle B1=Angle E1=arctan(8/15)=28.072 degrees.

These six angles add up to 180 degrees.

Angle A1=30.964 degrees

Angle B1=28.072 degrees

Angle C1=30.964 degrees

Angle D1=30.964 degrees

Angle E1=28.072 degrees

Angle F1=30.964 degrees

Sum=180.00000 degrees

The angles A1–F1 are reasonably close to the ideal angle of 30 degrees.

FIG. 18 shows the grid systems 210, 220a and 230a constructed by using the 4/7 ratio superimposed on each other. In accordance with another preferred embodiment of the present invention, the grid systems 210, 220a and 230a are used to route the conductors in the metal layers M1–M6. Near the center of FIG. 18, a grid intersection point 250 is shown. The grid intersection point 1200 is intersected by two grid lines from each of the grid systems 210, 220a and 230a. In other words, the grid intersection point 250 is intersected by one grid line for the metal layer M1, one grid line for the metal layer M2, one grid line for the metal layer M3, and so on. One grid line each of the metal layers M1–M6 intersect each other at the grid intersection point 250. A pattern similar to a dodecagon is formed around the grid intersection point 250.

FIG. 19 shows an enlarged view of the center of FIG. 18. FIG. 19 shows the angles formed between the grid lines for each of the metal layers M1–M6. The following summarizes angles G1–L1 formed between the grid lines.

Angle G1 formed between the lines 212 and the lines 231a=29.745 degrees

Angle H1 formed between the lines 231a and the lines 221a=30.510 degrees

Angle I1 formed between the lines 221a and the lines 211=29.745 degrees

Angle J1 formed between the lines 211 and the lines 232a=29.745 degrees

Angle K1 formed between the lines 232a and the lines 222a=30.510 degrees

Angle L1 formed between the lines 222a and the lines 212=29.745 degrees

Sum=180.00000 degrees

The values for the angles G1–L1 are derived by using equations similar to the ones used to derive the values for the angles A1–F1.

Angle G1=Angle I1=Angle J1=Angle L1=arctan(4/7)= 29.745 degrees.

Angle H1=Angle K1=arctan(33/56)=30.510 degrees.

Pentagonal Routing

FIG. 20 illustrates the geometry of the five metal layers routing according to preferred embodiments of the present invention. In preferred embodiments of the present invention, the paths or slopes formed by the five metal layers are approximately parallel to the five sides of an equilateral pentagon. In an equilateral pentagon, each of the five sides form an angles of thirty-six degrees with its adjacent sides. As shown in FIG. 20, the five metal layers are M1 301, M2 302, M3 303, M4 304 and M5 305. In the pentagonal routing system, vias are allowed between the metal layers where the paths or routings on different layers cross each other at predefined grid intersection points on the fundamental grid 100.

In the preferred embodiments of the present invention, ratios of integers are used to approximate the angles formed between the metal layers M1–M5. As discussed above, ratios of integer values are used so that the conductors in the metal layers would intersect the grid intersection points on the fundamental grid 100, and the ratios of integer values make it easy to find grid points where vias are allowed between the metal layers.

As shown in FIG. 20, the metal layer M1 301 forms a vertical path like the Y-axis, and the metal layer M2 303 has a slope of ¾ by following "three grids right and four grids up" construction rule. An angle of A2 is formed between the metal layer M1 301 and the metal layer M3 303.

$$\tan(A2)=3/4;$$

A2=arctan(¾)=36.870 degrees. Therefore, the conductors in the metal layer M1 301 and M3 303 form an angle of 36.870 degrees between them.

The metal layer M4 304 has a slope of ⅓ by following "three grids up and one grid up" construction rule. An angle of B2 is formed between the metal layer M3 303 and the metal layer M4 304 and is derived by the following.

$$\tan(A2+B2)=3$$

$$\tan(B2) = \tan((A2 + B2) - A2);$$
$$= \frac{\tan(A2+B2)-\tan(A2)}{1+\tan(A2+B2)*\tan(A2)};$$
$$= \frac{3-3/4}{1+3*3/4} = \frac{9/4}{13/4} = 9/13;$$

B2=arctan(9/13)=34.695 degrees. Therefore, the conductors in the metal layer M3 303 form an angle of 34.695 degrees with the conductor s in the M4 304 metal layer.

The metal layer M2 302 has a slope of –⅓ by following "three grids right and one grid down" construction rule. An angle C2 formed between the layers M2 302 and M4 304 is derived as follows.

$$\tan(C2)=\tan(2*\tan(C2/2);$$

$$\tan(C2) = \frac{2*\tan(C2/2)}{1-(\tan(C2/2))^2};$$
$$= \frac{2*1/3}{1-1/9} = \frac{2/3}{13/4} = 3/4;$$

C2=arctan(¾)=36.870 degrees.

The metal layer M5 305 has a slope of –⅘ by following "three grids right and four grids down" construction rule. An angle D2 is formed between the metal layers M2 302 and M5 305. The angle D2 is derived by the following equations.

$$\tan(A2+B2+C2+D2)=-3/4$$

$$\tan(D2)=\tan((A2+B2+C2+D2)-(A2+B2+C2));$$

$$D2=\arctan(9/13)=34.695 \text{ degrees}.$$

Finally, an angle E2 is formed between the metal layer M5 305 and M1 301. The angle E2 has a tangent of ¾ which means that the angle E2 is equal to 36.870 degrees.

$$\tan(E2)=3/4$$

$$E2=\arctan(3/4)=36.870 \text{ degrees}$$

In summary:
A2=C2=E2=arctan(¾)=36.870 degrees.
B2=D2=arctan(9/13)=34.695 degrees.
These five angles add up to 180 degrees.
A2=36.870 degrees
B2=34.695 degrees
C2=36.870 degrees
D2=34.695 degrees
E2=36.870 degrees
Sum=180.000 degrees The angels A2 to E2 are remarkably close to the ideal angle of 36 degrees.

Grid lines in a grid system used to route the five metal layers in the pentagonal routing system follow the geometry illustrated in FIG. 20. However, the pitch of the grid lines or the conductors following the grid lines should be at least one grid to obey the design rule.

Hexagonal Routing

FIG. 21 illustrates the geometry of the four metal layers routing according to preferred embodiments of the present invention. In preferred embodiments of the present invention, the angles formed between the metal layers are approximately equal to 60 degrees. As shown in FIG. 21, the four metal layers used in the hexagonal routing system will be referred to as M1 401, M2 402, M3 403 and M4 404.

In preferred embodiments of the present invention, ratios of integers are used to approximate the angles formed between metal layers M1–M4. As discussed above, ratios of integer values are used so that conductors in the metal layers would intersect the grid intersection points on the fundamental grid 100, and the ratios of integer values make it easy to find grid points where vias are allowed between the metal layers. In preferred embodiments of the present invention, two integer ratios of 3:5 and 4:7 are used to approximate sqrt(3) which comes from the following fact: tan(sqrt(3))=60 degrees. The two integer ratios of 3:5 and 4:7 are derived from the approximation scheme presented above in the dodecagonal routing section.

As shown in FIG. 21, the conductors in the metal layer M1 401 form vertical paths like the Y-axis and the conductors in the M2 402 layer form horizontal paths perpendicular to the conductors in the M1 401 layer. The conductors in the M3 403 and M4 404 layers form angles of approximately 60 and –60 degrees with the conductors in the M2 402 layers, respectively.

FIG. 22 illustrates a grid system 410 used by the M1–M4 layers in accordance with certain embodiments of the present invention. The grid system 410 is formed by using the 3:5 ratio. In the grid system 410, grid lines 411, 412, 413 and 414 lay out paths for the routings in the M1 401, M2 402, M3 403 and M4 404 metal layers, respectively. The grid lines 413 have a slope of 5/3 and form an angle of arctan (5/3)=59.036 degrees with the grid lines 412, and the grid lines 414 have a slope of –5/3 and form an angle of arctan (–5/3)=–59.036 degrees with the grid lines 502. Therefore, the angle between the grid lines 413 and 414 is 61.928 degrees. It is noted that all three angles are close to the ideal 60 degree angle. The pitch for the grid lines 411 and 412 is one grid, while the pitch for the grid lines 413 and 414 is 1.029 grids, about 3% larger than what is required by the design rule. Although the pitch is 3% larger than the minimum requirement, the hexagonal routing system gives shorter routings then the conventional Manhattan routing.

FIG. 23 illustrates a grid system 420 used by the M1–M4 layers in accordance with other embodiments of the present invention. The grid system 420 is formed by using the 4:7 ratio. In the grid system 420, grid lines 421, 422, 423 and 424 lay out the paths for the routings in the M1 401, M2 402, M3 403 and M4 404 metal layers, respectively. The grid lines 423 have a slope of 7/4 and form an angle of arctan (7/4)=60.225 degrees with the grid lines 422, and the grid lines 424 have a slope of –7/4 and form an angle arctan(– 7/4)=–60.225 degrees with the grid lines 422. Therefore, the angle between the gird lines 420 and 424 is 59.490 degrees. It is noted that all three angles are close to the ideal 60 degrees angle and add up to 180 degrees. The pitch for grid lines 421 and 422 is one grid, while the pitch for grid lines 423 and 424 is 0.9922 grids, about 1% smaller than what is required by the design rule. Although the pitch is 1% shorter than the minimum requirement, the hexagonal routing system gives shorter routings than the conventional Manhattan routing. However, the design rule must be flexible to allow for a pitch smaller than one grid.

Octagonal Routing

FIG. 24 illustrates the geometry of the five metal layers routing according to preferred embodiments of the present invention. In the octagonal routing system, vias are allowed between the metal layers where the paths or routings on different layers cross each other at predefined gird intersection points on the fundamental grid 100.

As shown in FIG. 24, a first metal layer (M1) 501 forms a vertical path like the Y-axis, and a second metal layer (M2) 502 forms a horizontal path like the X-axis. The routings in the M1 and M2 layers are perpendicular to each other. A third metal layer (M3) 503 also forms a vertical path like the M1 501 metal layer. FIG. 25 illustrates a grid system 510 used by the M1 501 and M2 502 layers in accordance with an embodiment of the present invention. Lines 511 in the grid system 510 lay out the paths for the routings in the M1 501 layer, while lines 512 lay out the paths for the routings in the M2 502 layer. The pitch for the grid system 510 is one grid, so, basically, the grid system 510 is equivalent to the fundamental grid 100. As discussed above, the routings in the M3 503 layer form vertical paths like the lines 511.

As shown in FIG. 24, the routings in a fourth metal layer (M4) 504 form a 45 degrees angle with the routings in the M2 502 layer, so, the routings in the M4 504 layer have a positive slope. In contrast, the routings in a fifth metal layer (M5) 505 form a 135 degree angle with the routings in the M2 502 layer, or equivalently, form a 45 degrees angle with the routings in the M1 510 layer.

FIG. 26 illustrates a grid system 520 used by the M4 504 and the M5 505 layers in accordance with an embodiment of the present invention. Lines 521 in the grid system 520 lay out the paths for the routings in the M4 504 layer, while lines 522 lay out the paths for the routings in the M5 505 layer. The pitch for the grid system 520 is $3\sqrt{2}/2=2.121$ grids, so, basically, the pitch for the grid system 520 is little bit more than the twice of the pitch for the grid system 510. Therefore, the grid system 520 conforms to the design rule. Double sized grids for the M4 504 and the M5 505 layers may be needed because of the difficulties encountered during the fabrication process.

FIG. 27 illustrates an area marked by 13×13 grid points on the fundamental grid 100. The grid lines 521 and 522 are imposed on the area in FIG. 27. The maximum length of routing available for the grid lines 521 and 522 in the area is $48\times\sqrt{2}=67.882$ grids, as shown in FIG. 27. However, if the grid lines 521 and 522 were vertical and horizontal lines like the grid lines 511 and 512 with a pitch of two instead of one, the maximum length of routing available for the grid lines 521 and 522 would be 72 grids, as shown in FIG. 27. Therefore, by having grid lines 521 and 522 which are at an angle of 45 degrees, there is a loss of 72.00−67.882=4.118 grids for the routings following the grid lines 521 and 522 which are at an angle of 45 degrees. Routings at 45 degrees in addition to routing vertically and horizontally gives "octagonal" routing.

However, it can be demonstrated that the octagonal routing requires less routing resources than just "Manhattan" routing. Thus, by using the octagonal routing, there will be fewer open nets, and smaller and less expensive die for the integrated circuits.

Generally, the methods described herein with respect to IC design will be practiced with a general purpose computer, either with a single processor or multiple processors. The methods described herein will also be generally implemented in an ECAD system running on a general purpose computer. FIG. 28 is block diagram of a general purpose computer system, representing one of many suitable computer platforms for implementing the methods described above. FIG. 28 shows a general purpose computer system 650 in accordance with the present invention. As shown in FIG. 28, computer system 650 includes a central processing unit (CPU) 652, read-only memory (ROM) 654, random access memory (RAM) 656, expansion RAM 658, input/output (I/O) circuitry 660, display assembly 662, input device 664, and expansion bus 666. Computer system 650 may also optionally include a mass storage unit 668 such as a disk drive unit or nonvolatile memory such as flash memory and a real-time clock 670.

CPU 652 is coupled to ROM 654 by a data bus 672, control bus 674, and address bus 676. ROM 654 contains the basic operating system for the computer system 650. CPU 652 is also connected to RAM 656 by busses 672, 674, and 676. Expansion RAM 658 is optionally coupled to RAM 656 for use by CPU 652. CPU 652 is also coupled to the I/O circuitry 660 by data bus 672, control bus 674, and address bus 676 to permit data transfers with peripheral devices.

I/O circuitry 660 typically includes a number of latches, registers and direct memory access (DMA) controllers. The purpose of I/O circuitry 660 is to provide an interface between CPU 652 and such peripheral devices as display assembly 662, input device 664, and mass storage 668.

Display assembly 662 of computer system 650 is an output device coupled to I/O circuitry 660 by a data bus 678. Display assembly 662 receives data from I/O circuitry 660 via bus 678 and displays that data on a suitable screen.

The screen for display assembly 662 can be a device that uses a cathode-ray tube (CRT), liquid crystal display (LCD), or the like, of the types commercially available from a variety of manufacturers. Input device 664 can be a keyboard, a mouse, a stylus working in cooperation with a position-sensing display, or the like. The aforementioned input devices are available from a variety of vendors and are well known in the art.

Some type of mass storage 668 is generally considered desirable. However, mass storage 668 can be eliminated by providing a sufficient mount of RAM 656 and expansion RAM 658 to store user application programs and data. In that case, RAMs 656 and 658 can optionally be provided with a backup battery to prevent the loss of data even when computer system 650 is turned off. However, it is generally desirable to have some type of long term mass storage 668 such as a commercially available hard disk drive, nonvolatile memory such as flash memory, battery backed RAM, PC-data cards, or the like.

A removable storage read/write device 669 may be coupled to I/O circuitry 660 to read from and to write to a removable storage media 671. Removable storage media 671 may represent, for example, a magnetic disk, a magnetic tape, an opto-magnetic disk, an optical disk, or the like. Instructions for implementing the inventive method may be provided, in one embodiment, to a network via such a removable storage media.

In operation, information is input into the computer system 650 by typing on a keyboard, manipulating a mouse or trackball, or "writing" on a tablet or on position-sensing screen of display assembly 662. CPU 652 then processes the data under control of an operating system and an application program, such as a program to perform steps of the inventive method described above, stored in ROM 654 and/or RAM 656. CPU 652 then typically produces data which is output to the display assembly 662 to produce appropriate images on its screen.

Expansion bus 666 is coupled to data bus 672, control bus 674, and address bus 676. Expansion bus 666 provides extra ports to couple devices such as network interface circuits, modems, display switches, microphones, speakers, etc. to CPU 652. Network communication is accomplished through the network interface circuit and an appropriate network.

Suitable computers for use in implementing the present invention may be obtained from various vendors. Various computers, however, may be used depending upon the size and complexity of the OPC tasks. Suitable computers include mainframe computers, multiprocessor computers, workstations or personal computers. In addition, although a general purpose computer system has been described above, a special-purpose computer may also be used.

It should be understood that the present invention also relates to machine readable media on which are stored program instructions for performing the methods of this invention. Such media includes, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

Although the present invention has been described in detail with regarding the exemplary embodiments and drawings thereof, it should be apparent to those skilled in the art that various adaptations and modifications of the present invention may be accomplished without departing from the spirit and scope of the invention. Accordingly, the invention is not limited to the precise embodiment shown in the drawings and described in detail hereinabove.

What is claimed is:

1. An integrated circuit comprising:
   a semiconductor layer;
   a plurality of cells formed on the semiconductor layer, each of the cells having terminals;
   a first metal layer having a first set of conductors extending in a first direction for interconnecting the terminals of the cells;
   a second metal layer having a second set of conductors extending in a second direction approximately orthogonal to the first direction for interconnecting the terminals of the cells;
   a third metal layer having a third set of conductors extending in a third direction for interconnecting the terminals of the cells;
   a fourth metal layer having a fourth set of conductors extending in a fourth direction approximately orthogonal to the third direction for interconnecting the terminals of the cells;
   a fifth metal layer having a fifth set of conductors extending in a fifth direction for interconnecting the terminals of the cells; and
   a sixth metal layer having a sixth set of conductors extending in a sixth direction approximately orthogonal to the fifth direction for interconnecting the terminals of the cells,
   wherein the third and the fourth directions form non-orthogonal angles with the first and the second directions, and the fifth and the sixth directions form non-orthogonal angles with the first, second, third and fourth directions.

2. The integrated circuit of claim 1, further comprising:
   a seventh metal layer having a seventh set of conductors extending in a seventh direction for interconnecting the terminals of the cells; and
   a eighth metal layer having a eighth set of conductors extending in a eighth direction approximately orthogonal to the seventh direction for interconnecting the terminals of the cells,
   wherein the seventh and the eighth directions form non-orthogonal angles with the first, second, third, fourth, fifth and sixth directions.

3. The integrated circuit of claim 2, wherein the third direction forms an angle of approximately 45 degrees with the second direction.

4. The integrated circuit of claim 3, wherein the fourth direction forms an angle of approximately 135 degrees with the second direction.

5. The integrated circuit of claim 4, wherein the fifth direction forms an angle of approximately 22 degrees with the second direction.

6. The integrated circuit of claim 5, wherein the sixth direction forms an angle of approximately 112 degrees with the second direction.

7. The integrated circuit of claim 6, wherein the seventh direction forms an angle of approximately 157 degrees with the second direction.

8. The integrated circuit of claim 7, wherein the eighth direction forms an angle of approximately 67 degrees with the second direction.

9. The integrated circuit of claim 2, wherein each of the fifth and sixth sets of conductors has a slope defined by a ratio of sequences of $a[n]:b[n]$ where
   $a[n+1]=b[n]$;
   $b[n+1]=a[n]+2*b[n]$; and
   n=set of integers.

10. The integrated circuit of claim 9, wherein each of the seventh and eighth sets of conductors has a slope defined by a ratio of sequences of $a[n]:b[n]$ where
    $a[n+1]=b[n]$;
    $b[n+1]=a[n]+2*b[n]$; and
    n=set of integers.

11. The integrated circuit of claim 2, wherein the first set of conductors is described by an equation $x=n$ where n=set of all integers.

12. The integrated circuit of claim 11, wherein the second set of conductors is described by an equation $y=n$ where n=set of all integers.

13. The integrated circuit of claim 12, wherein the third set of conductors is described by an equation $y=x+(3/2)*n$ where n=set of all integers.

14. The integrated circuit of claim 13, wherein the fourth set of conductors is described by an equation $y=-x+(3/2)*n$ where n=set of all integers.

15. The integrated circuit of claim 14, wherein the fifth set of conductors is described by an equation $y=2/5*x+(6/5)*n$ where n=set of all integers.

16. The integrated circuit of claim 15, wherein the sixth set of conductors is described by an equation $y=(-5/2)*x+3*n$ where n=set of all integers.

17. The integrated circuit of claim 16, wherein the seventh set of conductors is described by an equation $y=(-3/7)*x+(8/7)*n$ where n=set of all integers.

18. The integrated circuit of claim 17, wherein the eighth set of conductors is described by an equation y=⅔*x+(⅝)*n where n=set of all integers.

19. The integrated circuit of claim 2, wherein the third set of conductors is described by an equation y=x+(⅞)*n where n=set of all integers.

20. The integrated circuit of claim 19, wherein the fourth set of conductors is described by an equation y=−x+(⅞)*n where n=set of all integers.

21. The integrated circuit of claim 20, wherein the fifth set of conductors is described by an equation y=5/12*x+(13/12)*n where n=set of all integers.

22. The integrated circuit of claim 21, wherein the sixth set of conductors is described by an equation y=(−12/5)*x+(13/5)*n where n=set of all integers.

23. The integrated circuit of claim 22, wherein the seventh set of conductors is described by an equation y=(−7/17)*x+(19/17)*n where n=set of all integers.

24. The integrated circuit of claim 23, wherein the eighth set of conductors is described by an equation y=(17/7)*x+(19/7)*n where n=set of all integers.

25. An integrated circuit comprising:
a semiconductor layer;
a plurality of cells formed on the semiconductor layer, each of the cells having terminals; and
a plurality of metal layers, each of the metal layers having conductors for connecting the terminals,
wherein the conductors have slopes defined by ratios of non-zero integers.

26. The integrated circuit of claim 25, wherein the ratios are derived from sequences of a[n]:b[n] where
a[n+1]=b[n];
b[n+1]=a[n]+2*b[n]; and
n=set of integers.

27. An integrated circuit comprising:
a semiconductor layer;
a plurality of cells formed on the semiconductor layer, each of the cells having terminals;
a first metal layer having a first set of conductors extending in a first direction for interconnecting the terminals of the cells;
a second metal layer having a second set of conductors extending in a second direction approximately orthogonal to the first direction for interconnecting the terminals of the cells;
a third metal layer having a third set of conductors extending in a third direction for interconnecting the terminals of the cells;
a fourth metal layer having a fourth set of conductors extending in a fourth direction approximately orthogonal to the third direction for interconnecting the terminals of the cells;
a fifth metal layer having a fifth set of conductors extending in a fifth direction for interconnecting the terminals of the cells; and
a sixth metal layer having a sixth set of conductors extending in a sixth direction approximately orthogonal to the fifth direction for interconnecting the terminals of the cells,
wherein the third and the fourth directions form acute angles with the first and the second directions.

28. The integrated circuit of claim 27, wherein the fifth and the sixth directions form acute angles with the first and the second directions.

29. The integrated circuit of claim 28, wherein the fifth and the sixth directions form acute angles with the third and the fourth directions.

30. The integrated circuit of claim 29, wherein the fourth and the fifth directions form an angle of approximately 30 degrees with the second direction.

31. The integrated circuit of claim 30, wherein the third and the sixth directions form an angle of approximately 60 degrees with the second direction.

32. The integrated circuit of claim 27, wherein each of the third and fourth sets of conductors has a slope defined by a ratio of sequences of a[n]:b[n] where a[n+1]=a[n]+b[n];
b[n+1]=3*a[n]+b[n];
n=set of integers.

33. The integrated circuit of claim 32, wherein each the fifth and sixth sets of conductors has a slope defined by a ratio of sequences of a[n]:b[n] where a[n+1]=a[n]+b[n];
b[n+1]=3*a[n]+b[n];
n=set of integers.

34. The integrated circuit of claim 27, wherein the first set of conductors is described by an equation x=n, where n=sets of all integers.

35. The integrated circuit of claim 34, wherein the second set of conductors is described by an equation y=n, where n=set of all integers.

36. The integrated circuit of claim 27, wherein a pitch of the adjacent lines in the third set, fourth set, fifth set and sixth set of conductors is approximately 1.03 grids.

37. The integrated circuit of claim 27, wherein each of the third set, fourth set, fifth set, and the sixth set of conductors has a slope defined by a ratio of nonzero integers.

38. The integrated circuit of claim 37, wherein ratio is derived from sequences of a[n]:b[n], where a[n+1]=a[n]+b[n];
b[n+1]=3*a[n]+b[n];
n=set of integers.

39. An integrated circuit comprising:
a semiconductor layer;
a plurality of cells formed on the semiconductor layer, each of the cells having terminals; and
a plurality of conductors for interconnecting the terminals, wherein the conductors have slopes defined by ratios derived from sequences of an a[n]:b[n], where
a[n+1]=a[n]+b[n];
b[n+1]=3*a[n]+b[n];
n=set of integers.

40. An integrated circuit comprising:
a semiconductor layer;
a plurality of cells formed on the semiconductor layer, each of the cells having terminals;
a first metal layer having a first set of conductors extending in a first direction for interconnecting the terminals of the cells;
a second metal layer having a second set of conductors extending in a second direction for interconnecting the terminals of the cells;
a third metal layer having a third set of conductors extending in a third direction for interconnecting the terminals of the cells; and
a fourth metal layer having a fourth set of conductors extending in a fourth direction for interconnecting the terminals of the cells;
wherein the first direction forms acute angles with the third and the fourth directions, and the second direction forms acute angles with the third and the fourth directions.

41. The integrated circuit of claim 40, wherein the first direction forms an angle of approximately 30 degrees with the third direction.

42. The integrated circuit of claim 41, wherein the second direction forms an angle of approximately 60 degrees with the fourth direction.

43. The integrated circuit of claim 42, wherein the second direction forms an angle of approximately 60 degrees with the third direction.

44. The integrated circuit of claim 43, wherein the first direction forms an angle of approximately 30 degrees with the fourth direction.

45. The integrated circuit of claim 44, wherein the first direction forms an approximately perpendicular angle with the second direction.

46. The integrated circuit of claim 40, wherein the third and the fourth sets of conductors have slopes defined by ratios of non-zero integer values.

47. An integrated circuit comprising:
a semiconductor layer;
a plurality of cells formed on the semiconductor layer, each of the cells having terminals;
a first metal layer having a first set of conductors extending in a first direction for interconnecting the terminals of the cells;
a second metal layer having a second set of conductors extending in a second direction for interconnecting the terminals of the cells;
a third metal layer having a third set of conductors extending in a third direction for interconnecting the terminals of the cells; and
a fourth metal layer having a fourth set of conductors extending in a fourth direction for interconnecting the terminals of the cells,
wherein the third set of conductors has a slope of approximately 5/3, and the fourth set of conductors has a slope of approximately 7/4.

48. An integrated circuit comprising:
a semiconductor layer;
a plurality of cells formed on the semiconductor layer, each of the cells having terminals;
a first metal layer having a first set of conductors extending in a first direction for interconnecting the terminals of the cells;
a second metal layer having a second set of conductors extending in a second direction for interconnecting the terminals of the cells;
a third metal layer having a third set of conductors extending in a third direction for interconnecting the terminals of the cells; and
a fourth metal layer having a fourth set of conductors extending in a fourth direction for interconnecting the terminals of the cells,
wherein the third and the fourth sets of conductors have slopes defined by ratios derived from sequences of an a[n]:b[n], where
a[n+1]=a[n]+b[n];
b[n+1]=3*a[n]+b[n]; and
n=set of integers.

49. An integrated circuit comprising:
a semiconductor layer;
a plurality of cells formed on the semiconductor layer, each of the cells having terminals;
a first metal layer having a first set of conductors extending in a first direction for interconnecting the terminals of the cells;
a second metal layer having a second set of conductors extending in a second direction for interconnecting the terminals of the cells;
a third metal layer having a third set of conductors extending in a third direction for interconnecting the terminals of the cells;
a fourth metal layer having a fourth set of conductors extending in a fourth direction for interconnecting the terminals of the cells; and
a fifth metal layer having a fifth set of conductors extending in a fifth direction for interconnecting the terminals of the cells,
wherein the first, the second, the third, the fourth and the fifth directions form acute angles with each other.

50. The integrated circuit of claim 49, wherein the first direction forms an angle of approximately 36 degrees with the third and the fifth directions.

51. The integrated circuit of claim 50, wherein the third direction forms an angle of approximately 36 degrees with the fourth direction.

52. The integrated circuit of claim 51, wherein the fourth direction forms an angle of approximately 36 degrees with the second direction.

53. The integrated circuit of claim 52, wherein the second direction forms an angle of approximately 36 degrees with the fifth direction.

54. The integrated circuit of claim 49, wherein the second, the third, the fourth and the fifth sets of conductors have slopes defined by ratios of non-zero integer values.

55. An integrated circuit comprising:
a semiconductor layer;
a plurality of cells formed on the semiconductor layer, each of the cells having terminals;
a first metal layer having a first set of conductors extending in a first direction for interconnecting the terminals of the cells;
a second metal layer having a second set of conductors extending in a second direction for interconnecting the terminals of the cells;
a third metal layer having a third set of conductors extending in a third direction for interconnecting the terminals of the cells;
a fourth metal layer having a fourth set of conductors extending in a fourth direction for interconnecting the terminals of the cells; and
a fifth metal layer having a fifth set of conductors extending in a fifth direction for interconnecting the terminals of the cells,
wherein the third set of conductors has a slope of approximately 3/4, and the fourth set of conductors has a slope of a approximately 1/3.

56. The integrated circuit of claim 55, wherein the second set of conductors has a slope of approximately −1/3.

57. The integrated circuit of claim 56, wherein the fifth set of conductors has a slope of approximately −4/3.

58. An integrated circuit comprising:
a semiconductor layer;
a plurality of cells formed on the semiconductor layer, each of the cells having terminals;
a first metal layer having a first set of conductors extending in a first direction for interconnecting the terminals of the cells;

a second metal layer having a second set of conductors extending in a second direction for interconnecting the terminals of the cells;

a third metal layer having a third set of conductors extending in a third direction for interconnecting the terminals of the cells;

a fourth metal layer having a fourth set of conductors extending in a fourth direction for interconnecting the terminals of the cells; and a fifth metal layer having a fifth set of conductors extending in a fifth direction for interconnecting the terminals of the cells, wherein the first direction forms an angle of approximately 45 degrees with the fourth and the fifth directions.

59. The integrated circuit of claim 58, wherein the second direction forms an angle of approximately 45 degrees with the fourth and the fifth directions.

60. The integrated circuit of claim 59, wherein the fourth set of conductors has slope of approximately 1.

61. The integrated circuit of claim 60, wherein the fifth set of conductors has slope of approximately −1.

62. The integrated circuit of claim 58, wherein a pitch of the fourth set of conductors is approximately twice the pitch of the first set of conductors.

63. The integrated circuit of claim 62, wherein a pitch of the fifth set of conductors is approximately twice the pitch of the first set of conductors.

64. The integrated circuit of claim 63, wherein the pitch of the fourth set of conductors is approximately equivalent to the pitch of the fifth set of conductors.

65. The integrated circuit of claim 64, wherein the pitch of the fourth set of conductors is approximately equal to 2.1 grids.

66. The integrated circuit of claim 65, wherein the pitch of the fifth set of conductors is approximately equal to 2.1 grids.

* * * * *